United States Patent
Yim et al.

(10) Patent No.: US 11,228,290 B2
(45) Date of Patent: Jan. 18, 2022

(54) MIXER HAVING PHASE SHIFT FUNCTION AND COMMUNICATIONS DEVICE INCLUDING THE SAME

(71) Applicant: SAMSUNG ELECTRONICS CO., LTD., Suwon-si (KR)

(72) Inventors: Jounghyun Yim, Suwon-si (KR); Taewan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 16/852,673

(22) Filed: Apr. 20, 2020

(65) Prior Publication Data
US 2021/0111678 A1    Apr. 15, 2021

(30) Foreign Application Priority Data
Oct. 14, 2019    (KR) .................. 10-2019-0127290

(51) Int. Cl.
*H04B 1/30*    (2006.01)
*H03F 3/24*    (2006.01)
(Continued)

(52) U.S. Cl.
CPC .............. *H03F 3/24* (2013.01); *H03D 7/1458* (2013.01); *H03D 7/165* (2013.01); *H03F 3/211* (2013.01); *H04B 1/30* (2013.01); *H03F 2200/451* (2013.01)

(58) Field of Classification Search
CPC ........ H04B 1/30; H04B 10/08; H03D 7/1485; H03D 7/165; H03F 3/211; H03F 3/24
See application file for complete search history.

(56) References Cited

U.S. PATENT DOCUMENTS

| | | |
|---|---|---|
| 9,743,354 B2 | 8/2017 | Chakraborty |
| 10,009,050 B2 | 6/2018 | Chen et al. |
| 2016/0126894 A1 | 5/2016 | Lakdawala et al. |

FOREIGN PATENT DOCUMENTS

| | | |
|---|---|---|
| JP | 2003-142923 | 5/2003 |
| JP | 3709357 | 8/2005 |

(Continued)

OTHER PUBLICATIONS

Richard Tseng, et al. "A Four-Channel Beamforming Down-Converter in 90-NM CMOS Utilizing Phase-Oversampling", IEEE Journal of Solid-State Circuits, vol. 45, No. 11, Nov. 2010. pp. 2262-2272.

(Continued)

*Primary Examiner* — Thanh C Le
(74) *Attorney, Agent, or Firm* — F. Chau & Associates, LLC

(57) ABSTRACT

A mixer includes a load portion connected between an input terminal of a first power voltage and an output terminal of the radio frequency transmit signal and configured to adjust a magnitude of the radio frequency transmit signal, a first switching unit connected to an output terminal of the radio frequency transmit signal, and configured to perform a first switching operation in response to a plurality of local oscillation signals, and a second switching unit connected between the first switching unit and an input terminal of a second power voltage, lower than the first power voltage, and configured to perform a second switching operation in response to a plurality of baseband signals, the plurality of local oscillation signals include an I+ baseband signal, an I− baseband signal, a Q+ baseband signal, and a Q− baseband signal, and the second switching unit includes a first branch performing a switching operation under control of the I+ baseband signal and the Q+ baseband signal, a second branch performing a switching operation under control of (Continued)

the I− baseband signal and the Q− baseband signal, a third branch performing a switching operation under control of the Q+ baseband signal and the I− baseband signal, and a fourth branch performing a switching operation under control of the Q− baseband signal and the I+ baseband signal.

20 Claims, 14 Drawing Sheets

(51) Int. Cl.
*H03D 7/16* (2006.01)
*H03F 3/21* (2006.01)
*H03D 7/14* (2006.01)

(56) References Cited

FOREIGN PATENT DOCUMENTS

JP  5633270  10/2014
JP  6249974  12/2017

OTHER PUBLICATIONS

Bodhisatwa Sadhu, et al. "A 28GHZ 32-Element Phased-Array Transceiver IC With Concurrent Dual Polarized Beams and 1.4 Degree Beam-Steering Resolution for 5G Communication", IEEE ISSCC 2017, pp. 6-8.

MIXER HAVING PHASE SHIFT FUNCTION AND COMMUNICATIONS DEVICE INCLUDING THE SAME

CROSS-REFERENCE TO RELATED APPLICATION

This application claims priority under 35 U.S.C. § 119 to Korean Patent Application No. 10-2019-0127290 filed on Oct. 14, 2019 in the Korean Intellectual Property Office, the disclosure of which is incorporated herein by reference in its entirety.

TECHNICAL FIELD

The present inventive concept relates to a mixer having a phase shift function, and a communications device including the same.

DISCUSSION OF RELATED ART

Research and development of next generation wireless communications techniques using an extremely high frequency band have been actively conducted. For example, to alleviate loss in a transmission path of an extremely high frequency signal and to increase a transmission distance, techniques such as beamforming, a massive multi-input multi-output (massive MIMO), a full dimensional MIMO (FD-MIMO), an array antenna, and a large-scale antenna have been discussed.

Among such next generation wireless communications techniques, a beamforming technique is used to increase communications efficiency by concentrating an extremely high frequency signal in a certain direction. To perform a beamforming technique, a phase shifter might be used. When a phase shifter operates in an extremely high frequency band, signal loss might increase such that a deterioration of performance might result, such as manifested by an increase of gain, an increase of current consumption, an increase of chip area, or the like.

SUMMARY

An exemplary embodiment of the present inventive concept provides a mixer which may shift a phase of a radio frequency (RF) signal without using a phase shifter, and a communications device including the same.

According to an exemplary embodiment of the present inventive concept, a mixer includes a load portion connected between an input terminal of a first power voltage and an output terminal of the radio frequency transmit signal and configured to adjust a magnitude of the radio frequency transmit signal, a first switching unit connected to an output terminal of the radio frequency transmit signal, and configured to perform a first switching operation in response to a plurality of local oscillation signals, and a second switching unit connected between the first switching unit and an input terminal of a second power voltage, lower than the first power voltage, and configured to perform a second switching operation in response to a plurality of baseband signals, the plurality of local oscillation signals include an I+ baseband signal, an I− baseband signal, a Q+ baseband signal, and a Q− baseband signal, and the second switching unit includes a first branch performing a switching operation under control of the I+ baseband signal and the Q+ baseband signal, a second branch performing a switching operation under control of the I− baseband signal and the Q− baseband signal, a third branch performing a switching operation under control of the Q+ baseband signal and the I− baseband signal, and a fourth branch performing a switching operation under control of the Q− baseband signal and the I+ baseband signal.

According to an exemplary embodiment of the present inventive concept, a communications device includes a modulator configured to generate a plurality of first baseband signals by modulating a transmit bitstream, a local oscillation signal generator configured to generate a plurality of first local oscillation signals and to generate a plurality of second local oscillation signals phase-shifted by a first phase value with respect to the plurality of first local oscillation signals by multiplexing the plurality of first local oscillation signals, and a mixer configured to generate a radio frequency transmit signal by up-conversion of the plurality of first baseband signals using the plurality of second local oscillation signals, and the mixer is configured to generate a plurality of second baseband signals phase-shifted by a second phase value with respect to the plurality of first baseband signals by combining the plurality of first baseband signals and to perform a mixing operation with respect to the plurality of second baseband signals and the plurality of second local oscillation signals.

According to an exemplary embodiment of the present inventive concept, a communications device includes a modem configured to generate a transmit baseband signal by modulating a transmit bitstream, and to demodulate a receive baseband signal to a receive bitstream, a transmitter circuit configured to generate a radio frequency transmit signal by frequency up-conversion of the transmit baseband signal using a transmit local oscillation signal, and a receiver circuit configured to generate the receive baseband signal by frequency down-conversion of a radio frequency receive signal using a receive local oscillation signal, the transmit local oscillation signal and the receive local oscillation signal are obtained by phase-shifting a quadrature signal, and the transmitter circuit is configured to perform the frequency up-conversion for the phase-shifted transmit baseband signal after phase-shifting the transmit baseband signal.

BRIEF DESCRIPTION OF THE DRAWINGS

The above and other aspects of the present inventive concept will be more clearly understood from the following detailed description, taken in conjunction with the accompanying drawings, in which.

DETAILED DESCRIPTION

Hereinafter, exemplary embodiments of the present inventive concept will be described with reference to the accompanying drawings. It shall be understood that such exemplary embodiments are illustrative of, but limiting to, the present inventive concept.

Figure 1:
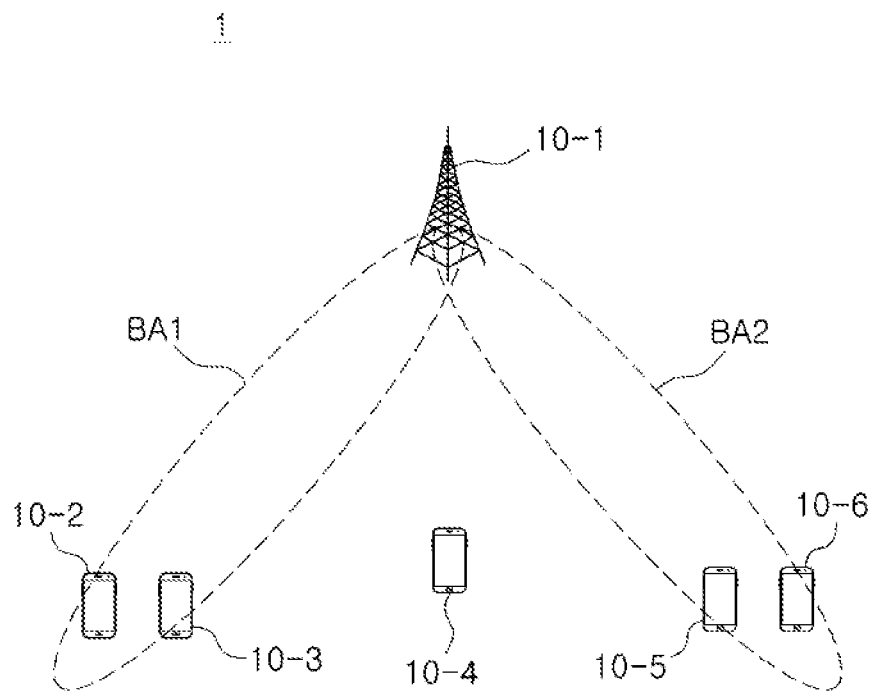
FIG. 1 is a schematic diagram illustrating a wireless communications system according to an exemplary embodiment of the present inventive concept.

FIG. 1 illustrates a wireless communications system according to an exemplary embodiment of the present disclosure.

Referring to FIG. 1, a wireless communications system 1 may include a plurality of communications devices 10-1 to 10-6, each performing wireless communications using a transceiver. The wireless communications system 1 may include a 4th generation (4G) network system such as a long-term evolution (LTE) system, or the like, a 5th generation (5G) network system supporting a new radio (NR) protocol prescribed in 3GPP, or the like.

Some of the plurality of communications devices 10-1 to 10-6 may be base stations (BS), and the others may be user equipment (UE). The BS may be a subject communicating with the UE, and may be referred to as a base transceiver station (BTS), a node b (NB), an evolved-node b (eNB), access point (AP), or the like. The UE may be a subject communicating with a BS and/or other UEs, and may be referred to as a mobile station (MS), mobile equipment (ME), a terminal, or the like. FIG. 1 illustrates an example in which the first communications device 10-1 is implemented as a BS, and the second to sixth communications devices 10-2 to 10-6 are implemented as UEs. However, embodiments thereof are not limited thereto.

The plurality of communications devices 10-1 to 10-6 may perform wireless communications using a wireless signal having a wavelength of an ultrahigh frequency band. For example, the plurality of communications devices 10-1 to 10-6 may perform wireless communications using a millimeter wave (mmWave) having a wavelength of 1 mm to 100 mm corresponding to a wireless frequency of 3 GHz to 300 GHz. The plurality of communications devices 10-1 to 10-6 may also perform wireless communications using a wave of terahertz band.

The plurality of communications devices 10-1 to 10-6 may perform beamforming to reduce signal loss caused by channel propagation properties of an ultrahigh frequency band.

The beamforming may be divided into transmission beamforming performed by transmitters of the communications devices 10-1 to 10-6 and reception beamforming performed by receivers of the communications devices 10-1 to 10-6. The plurality of communications devices 10-1 to 10-6 may perform transmission beamforming using a plurality of antennas and may concentrate a reaching area (hereinafter, referred to as a beam area) of a signal in a certain direction, thereby increasing directivity of the signal. As the plurality of communications devices 10-1 to 10-6 increases directivity of a signal by performing transmission beamforming, the plurality of communications devices 10-1 to 10-6 may increase a reaching distance of a signal and may decrease signal interference. Also, the plurality of communications devices 10-1 to 10-6 may perform reception beamforming using a plurality of antennas and may concentrate a reception direction of a signal in a certain direction, thereby increasing reception sensitivity and reducing signal interference.

Referring to FIG. 1, the first communications device 10-1 may transmit a first wireless signal having a first beam area BA1 and a second wireless signal having a second beam area BA2. As the second communications device 10-2 and the third communications device 10-3 are included in the first beam area BA1, the second communications device 10-2 and the third communications device 10-3 may receive the first wireless signal. Also, as the fifth communications device 10-5 and the sixth communications device 10-6 are included in the second beam area BA2, the fifth communications device 10-5 and the sixth communications device 10-6 may receive the second wireless signal. However, as the third communications device 10-3 is not included in either of the first beam area BA1 or the second beam area BA2, the third communications device 10-3 may not receive the first wireless signal or the second wireless signal.

The plurality of communications devices 10-1 to 10-6 may perform beamforming using a plurality of radio frequency (RF) signals having a certain phase difference therebetween. Generally, a plurality of communications devices might use a phase shifter to generate the plurality of RF signals having a certain phase difference therebetween. However, when a phase shifter is used, signal loss may increase such that performance deterioration, such as a decrease of a gain, an increase of current consumption, an increase of a chip area, or the like, may occur. Thus, the communications device of the exemplary embodiment may multiplex a local oscillation signal to a quadrature signal and may input the quadrature signal to a mixer, and may phase-shift a baseband signal on a source terminal of the mixer, thereby generating a plurality of RF signals having a certain phase difference therebetween without using a phase-shifter.

Figure 2:
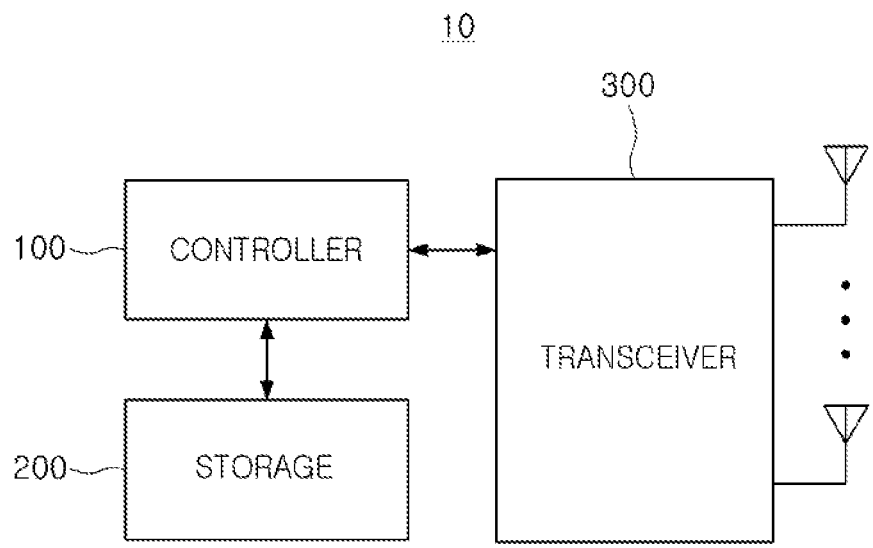
FIG. 2 is a block diagram illustrating a communications device according to an exemplary embodiment of the present inventive concept.

FIG. 2 illustrates a communications device according to an exemplary embodiment of the present disclosure.

Referring to FIG. 2, a communications device 10 may include a controller 100, a storage 200 connected to at least one of the controller or a transceiver, and a transceiver 300 connected to at least one of the controller or the storage.

The controller 100 may control overall operations of the communications device 10. For example, the controller 100 may control the transceiver 300 for the communications device 10 to transmit and receive an RF signal. In an exemplary embodiment, the controller 100 may control the transceiver 300 to generate a plurality of RF signals having a certain phase difference therebetween to perform transmission beamforming. The controller 100 may also control the transceiver 300 to selectively activate at least some of a plurality of antennas to perform reception beamforming. The controller 100 may include at least one processor or microprocessor.

The storage 200 may store various data required for operation of the communications device 10. For example, the storage 200 may store various programs and setting information required for wireless communication. The storage 200 may be implemented by a non-volatile memory such as a NAND flash memory, or the like, a volatile memory such as a DRAM, or the like, or a combination of a non-volatile memory and a volatile memory.

The transceiver 300 may transmit an RF signal to and receive an RF signal from other communications devices through a plurality of antennas. For example, the transceiver 300 may perform frequency up-conversion of a baseband signal to an RF signal, and may transmit an RF signal through the plurality of antennas. The transceiver 300 may also perform frequency down-conversion of an RF signal received through the plurality of antennas to a baseband signal.

To perform such a wireless communications function, the transceiver 300 may include a modem, a filter, a mixer, an amplifier, or the like. The transceiver 300 may also include a plurality of antennas. The collection of the plurality of antennas may be referred to as an antenna array, and each of the plurality of antennas included in the antenna array may be referred to as an array element. The antenna array may be implemented as various types of antenna arrays, such as a linear array, a planar array, or the like.

FIG. 2 illustrates an example in which the transceiver 300 is implemented as a single element including a transmitter and a receiver integrated with each other, but embodiments thereof are not limited thereto. For example, the transceiver 300 may include a transmitter and a receiver separated from each other. In the description below, the transceiver 300 will be described in greater detail with reference to FIG. 3.

Figure 3:
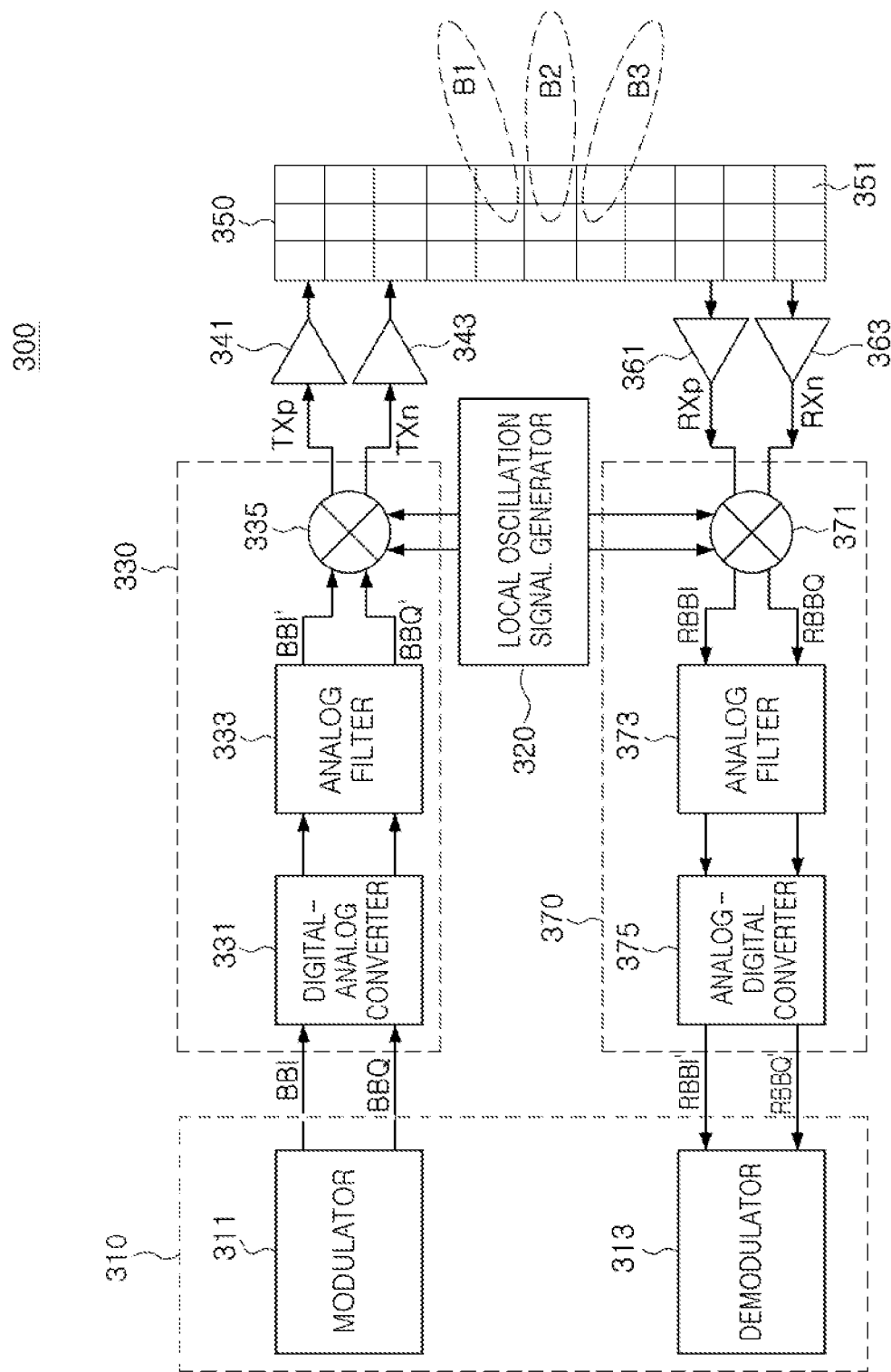
FIG. 3 is a hybrid diagram illustrating a transceiver according to an exemplary embodiment of the present inventive concept.

FIG. 3 illustrates a transceiver according to an exemplary embodiment of the present disclosure.

Referring to FIG. 3, a transceiver 300 may include a modem 310, a transmitter circuit 330, transmit amplifiers 341 and 343, receive amplifiers 361 and 363, a receiver circuit 370, and an antenna array 350.

The modem 310 may include a modulator 311 and a demodulator 313, and may interconvert a baseband signal and a bitstream in accordance with a physical layer specification of a system.

The modulator 311 may modulate a transmit bitstream and may generate a transmit baseband signal BBI and BBQ. The transmit baseband signal BBI and BBQ may be a digital signal, and may be a quadrature signal including an in-phase (I– phase) baseband signal BBI of a real number area and a quadrature-phase (Q– phase) baseband signal BBQ of an imaginary area. The I– phase baseband signal BBI may include an I+ baseband signal BBIp and an I– baseband signal BBIn having a phase difference of 180 degrees therebetween. The Q– phase baseband signal BBQ may include a Q+ baseband signal BBQp and a Q– baseband signal BBQn having a phase difference of 180 degrees therebetween.

The demodulator 313 may demodulate a receive baseband signal RBBI' and RBBQ' and may recover a receive bitstream. The receive baseband signal RBBI' and RBBQ' may be a digital signal, and may include an I– phase baseband signal RBBI' and a Q– phase baseband signal RBBQ'. The I– phase baseband signal RBBI' may include an I+ baseband signal RBBIp' and an I– baseband signal RBBIn'. Also, a Q– phase baseband signal RBBQ' may include a Q+ baseband signal RBBQp' and a Q– baseband signal RBBQn'.

Figure 8:
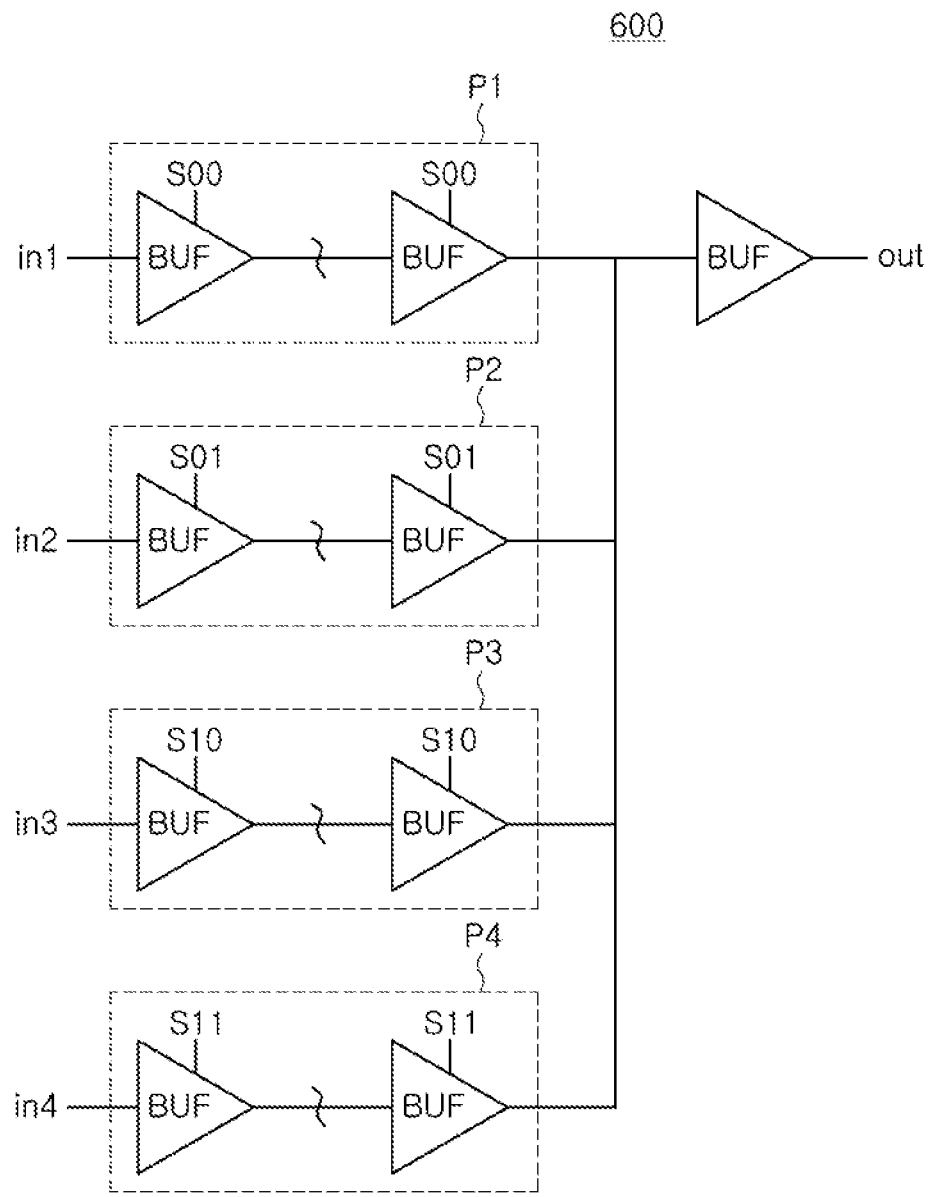
FIG. 8 is a circuit diagram illustrating a multiplexer of FIG. 4.

A local oscillation signal generator 320 may generate a local oscillation signal, may multiplex the generated local oscillation signal, and may provide the multiplexed oscillation signal to the transmitter circuit 330 and the receiver circuit 370. A specific configuration and an operation method of the local oscillation signal generator 320 are illustrated in FIGS. 4 and 8.

The transceiver may selectively activate a plurality of antennas or antenna elements with a plurality of phase shifts to perform reception beamforming for a receive signal from a certain direction. The transceiver 300 may include a receive mixer 371 configured to generate a plurality of first baseband receive signals RBBIp, RBBIn, RBBOp and RBBQn by down-conversion of a plurality of radio frequency receive signals RXp and RXn using a plurality of second local oscillation signals LOIp', LOIn', LOQp' and LOQn'. The transceiver may be configured to generate a plurality of second baseband receive signals RBBIp', RBBIn', RBBOp' and RBBQn' phase-shifted by a phase value with respect to the plurality of first baseband receive signals RBBIp, RBBIn, RBBQp and RBBQn by combining the plurality of first baseband receive signals and performing a mixing operation with respect to the plurality of second baseband receive signals using the plurality of second local oscillation signals and the plurality of first local oscillation signals LOIp, LOIn, LOQp and LOQn. The plurality of first baseband receive signals may be analog signals and the plurality of second baseband receive signals may be digital signals.

FIGS. 4 to 8 collectively illustrate a local oscillation signal generator according to an exemplary embodiment of the present disclosure.

Figure 4:
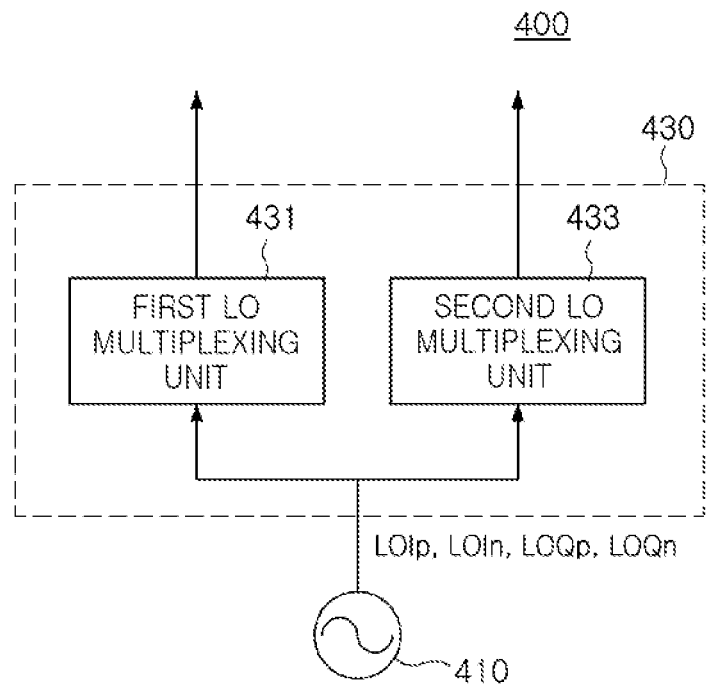
FIG. 4 is a circuit diagram illustrating part of a local oscillation signal generator of FIG. 3.

Referring to FIG. 4, a local oscillation signal generator 400 may include a local oscillator 410 and a local oscillation (LO) buffer 430.

The local oscillator 410 may generate a plurality of quadrature signals LOIp, LOIn, LOQp, and LOQn as local oscillation signals. In an exemplary embodiment, the local oscillator 410 may include a voltage-controlled oscillator (VCO).

The LO buffer 430 may shift phases of the plurality of local oscillation signals LOIp, LOIn, LOQp, and LOQn by multiplexing the plurality of local oscillation signals LOIp, LOIn, LOQp, and LOQn generated by the local oscillator 410. In an exemplary embodiment, phase-shift values of the plurality of local oscillation signals LOIp, LOIn, LOQp, and LOQn may be 90-degree units (which are, 0, 90, 180, and 270 degrees).

The LO buffer 430 may include a first LO multiplexing unit 431 outputting local oscillation signals LOIp and LOIn of an I– phase and a second LO multiplexing unit 433 outputting local oscillation signals LOQp and LOQn of a Q– phase. FIG. 4 illustrates an example in which the LO buffer 430 includes the first LO multiplexing unit 431 and the second LO multiplexing unit 433, but an exemplary embodiment thereof is not limited thereto. For example, the LO buffer 430 may include four LO multiplexing units outputting the plurality of local oscillation signals LOIp, LOIn, LOQp, and LOQn, respectively.

FIGS. 5 to 7D illustrate an example of the first and second LO multiplexing units 431 and 433 illustrated in FIG. 4.

Figure 5:
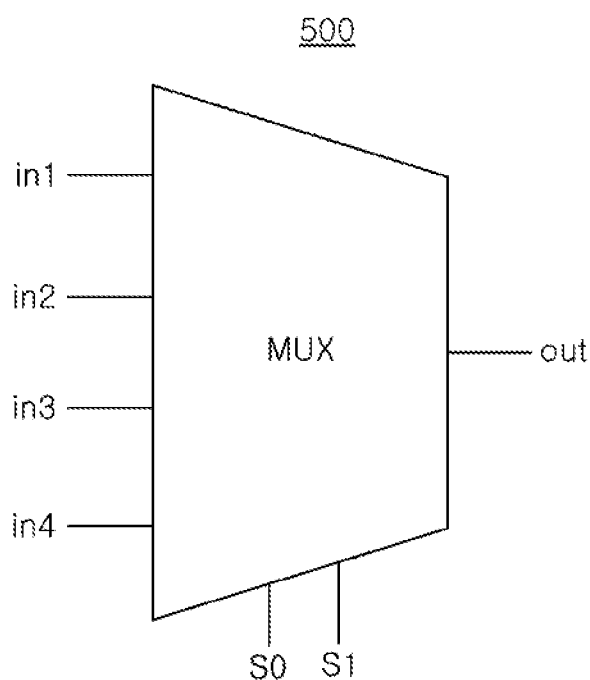
FIG. 5 is a circuit diagram illustrating a multiplexer of FIG. 4.

Referring to FIG. 5, an LO multiplexing unit 500 may be implemented as a multiplexer MUX. The LO multiplexer 500 may select one of a plurality of input signals as one of I− phase and Q− phase local oscillation signals, thereby outputting a phase-shifted local oscillation signal. For example, when the LO multiplexing unit 500 is implemented as a 4×1 multiplexer, the LO multiplexing unit 500 may receive a plurality of local oscillation signals LOIp, LOIn, LOQp, and LOQn from a local oscillator as first to fourth input signals in1 to in4, and may select one of the first to fourth input signals in1 to in4 as an I+ local oscillation signal LOIp on the basis of first and second control signals S0 and S1 and may output the selected signal.

In an exemplary embodiment, the local oscillation signals LOIp, LOIn, LOQp, and LOQn, determined as an output signal out, may be phase-shifted in accordance with a result of signal selection based on combination of the local oscillation signals LOIp, LOIn, LOQp, and LOQn and the control signals S0 and S1 as the input signals in1 to in4.

Figures 6, 7A, 7B, 7C, 7D:
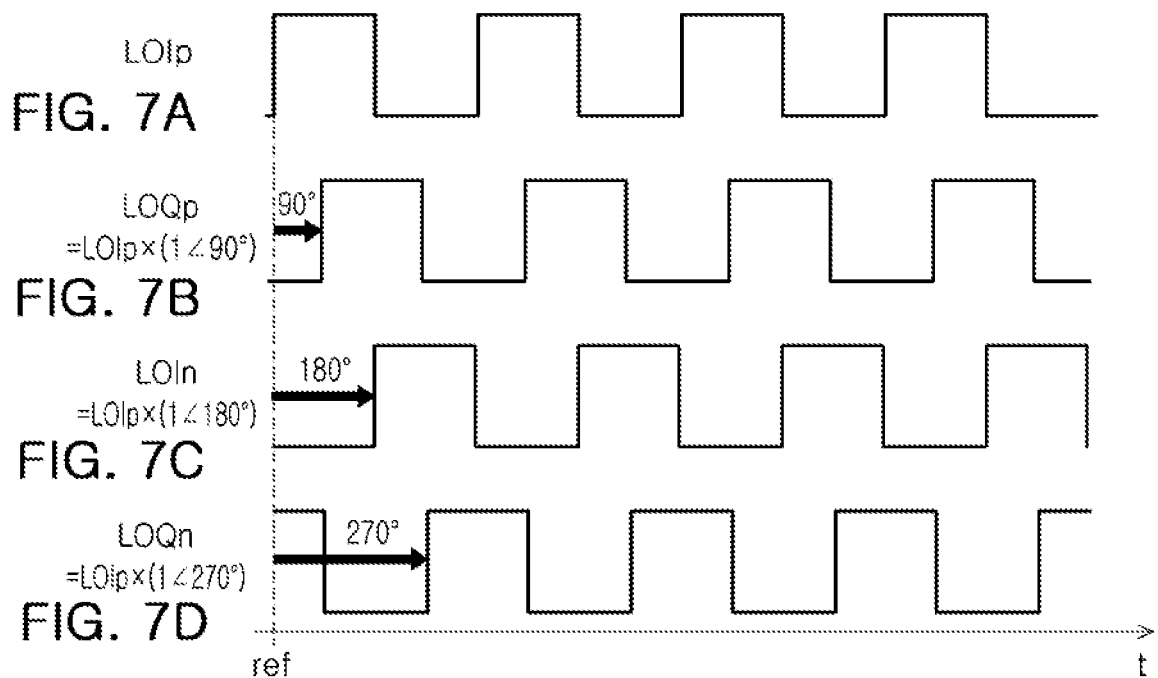
FIG. 6 is a tabular diagram illustrating a multiplexer of FIG. 4.
FIGS. 7A, 7B, 7C and 7D are phase-offset signal diagrams for a multiplexer of FIG. 4.

The combination of the local oscillation signals LOIp, LOIn, LOQp, and LOQn as the input signals in1 to in4, and the phase-shifting of the local oscillation signals LOIp', LOIn', LOQp', and LOQn' as the output signals out are illustrated in FIG. 6.

Referring to FIG. 6 along with FIG. 5, in a first case, an I+ local oscillation signal LOIp, a Q+ local oscillation signal LOQp, an I− local oscillation signal LOIn, and a Q− local oscillation signal LOQn may be input to an LO multiplexing unit 500 in order as input signals in1 to in4. Also, the LO multiplexing unit 500 may set the I+ local oscillation signal LOIp' as an output signal out. The above-described operation may be implemented by connecting an output terminal of the LO multiplexing unit 500 to a source terminal of the I+ local oscillation signal LOIp' of a mixer.

When the first control signal S0 is "0" (or a logic low), and the second control signal S1 is "0," the LO multiplexing unit 500 may select the I+ local oscillation signal LOIp, the first input signal in1. As there is no phase difference between the selected signal and the I+ local oscillation signal LOIp, the first input signal in1, the phase-shifting of the I+ local oscillation signal LOIp' may not occur as in FIG. 7A.

When the first control signal S0 is "0," and the second control signal S1 is "1," the LO multiplexing unit 500 may select the Q+ local oscillation signal LOQp, the second input signal in2. As a phase difference between the selected signal and the I+ local oscillation signal LOIp, and an output signal out, is 90 degrees, the I+ local oscillation signal LOIp' may be phase-shifted by 90 degrees as in FIG. 7B.

When the first control signal S0 is "1," and the second control signal S1 is "0," the LO multiplexing unit 500 may select the I− local oscillation signal LOIn, a third input signal in3. As a phase difference between the selected signal and the I+ local oscillation signal LOIp, and an output signal out, is 180 degrees, the I+ local oscillation signal LOIp' may be phase-shifted by 180 degrees as in FIG. 7C.

When the first control signal S0 is "1," and the second control signal S1 is "1," the LO multiplexing unit 500 may select the Q− local oscillation signal LOQn, a fourth input signal in4. As a phase difference between the selected signal and the I+ local oscillation signal LOIp, and an output signal out, is 270 degrees, the I+ local oscillation signal LOIp' may be phase-shifted by 270 degrees as in FIG. 7D.

In a second case, the I− local oscillation signal LOIn, the Q− local oscillation signal LOQn, the I+ local oscillation signal LOIp, and the Q+ local oscillation signal LOQp may be input to the LO multiplexing unit 500 in order as the first to fourth input signals in1 to in4. The LO multiplexing unit 500 may set the I− local oscillation signal LOIn' as an output signal out. The above-described operation may be implemented by connecting an output terminal of the LO multiplexing unit 500 to a source terminal of the I− local oscillation signal LOIn' of a mixer.

As in the first case, when the first control signal S0 is "0," and the second control signal S1 is "0," the phase-shifting of the I− local oscillation signal LOIn', an output signal out, may not occur. When the first control signal S0 is "0," and the second control signal S1 is "1," the I− local oscillation signal LOIn', an output signal out, may be phase-shifted by 90 degrees. When the first control signal S0 is "1," and the second control signal S1 is "0," the I− local oscillation signal LOIn', an output signal out, may be phase-shifted by 180 degrees. When the first control signal S0 is "1," and the second control signal S1 is "1," the I− local oscillation signal LOIn', an output signal out, may be phase-shifted by 270 degrees.

In a third case, the Q+ local oscillation signal LOQp, the I− local oscillation signal LOIn, the Q− local oscillation signal LOQn, and the I+ local oscillation signal LOIp may be input to the LO multiplexing unit 500 in order as the first to fourth input signals in1 to in4. Also, the LO multiplexing unit 500 may set the Q+ local oscillation signal LOQp' as an output signal out. The above-described operation may be implemented by connecting an output terminal of the LO multiplexing unit 500 to a source terminal of the Q+ local oscillation signal LOQp' of a mixer.

As in the first case, when the first control signal S0 is "0," and the second control signal S1 is "0," the phase-shifting of the Q+ local oscillation signal LOQp', an output signal out, may not occur. When the first control signal S0 is "0," and the second control signal S1 is "1," the Q+ local oscillation signal LOQp', an output signal out, may be phase-shifted by 90 degrees. When the first control signal S0 is "1," and the second control signal S1 is "0," the Q+ local oscillation signal LOQp', an output signal out, may be phase-shifted by 180 degrees. When the first control signal S0 is "1," and the second control signal S1 is "1," the Q+ local oscillation signal LOQp', an output signal out may be phase-shifted by 270 degrees.

In a fourth case, the Q− local oscillation signal LOQn, the I+ local oscillation signal LOIp, the Q+ local oscillation signal LOQp, and the I− local oscillation signal LOIn may be input to the LO multiplexing unit 500 in order as the first to fourth input signals in1 to in4. Also, the LO multiplexing unit 500 may set the Q− local oscillation signal LOQn' as an output signal output. The above-described operation may be implemented by connecting an output terminal of the LO multiplexing unit 500 to a source terminal of the Q− local oscillation signal LOQn' of a mixer.

As in the first case, when the first control signal S0 is "0," and the second control signal S1 is "0," the phase-shifting of the Q− local oscillation signal LOQn', an output signal out, may not occur. When the first control signal S0 is "0," and the second control signal S1 is "1," the Q− local oscillation signal LOQn', an output signal out may be phase-shifted by 90 degrees. When the first control signal S0 is "1," and the second control signal S1 is "0," the Q− local oscillation signal LOQn', an output signal out, may be phase-shifted by 180 degrees. When the first control signal S0 is "1," and the second control signal S1 is "1," the Q− local oscillation signal LOQn', an output signal out may be phase-shifted by 270 degrees.

A transceiver in the exemplary embodiment may multiplex a local oscillation signal on an LO buffer terminal before a mixer and may perform the phase-shifting of 90 degrees, thereby endowing a phase-shifting function to the mixer. Also, by not performing the multiplexing of a local oscillation signal on a main signal path, signal loss may be prevented and a gain may increase.

FIG. 8 illustrates another example of the first and second LO multiplexing units 431 and 433.

Referring to FIG. 8, an LO multiplexing unit 600 may be implemented by combination of a plurality of buffers BUF. The LO multiplexing unit 600 may include a plurality of buffer paths P1 to P4 activated in response to a plurality of control signals S00 to S11. A plurality of different local oscillation signals LOIp, LOIn, LOQp, and LOQn may be input to the plurality of buffer paths P1 to P4, and the LO multiplexing unit 600 may perform the phase-shifting of the local oscillation signals LOIp', LOIn', LOQp', and LOQn' determined as output signals out by selecting one of the local oscillation signals input in response to the plurality of control signals S00 to S11. The above-described operation may be implemented by connecting an output terminal of the LO multiplexing unit 600 to a source terminal of a certain local oscillation signal of a mixer.

For example, the LO multiplexing unit 600 may include a first buffer path P1 including a plurality of buffers BUF operating in response to a first control signal S00, a second buffer path P2 including a plurality of buffers BUF operating in response to a second control signal S01, a third buffer path P3 including a plurality of buffers BUF operating in response to a third control signal S10, and a fourth buffer path P4 including a plurality of buffer BUF operating in response to a fourth control signal S11.

The phase-shifting of the local oscillation signals LOIp', LOIn', LOQp', and LOQn', output signals out, may occur in accordance with combination of the plurality of local oscillation signals LOIp, LOIn, LOQp, and LOQn input to the first to fourth buffer paths P1 to P4, and an activated status of the first to fourth buffer paths P1 to P4 on the basis of the first to fourth control signals S00 to S11. In an exemplary embodiment, the LO multiplexing unit 600 may phase-shift the plurality of local oscillation signals LOIp, LOIn, LOQp, and LOQn by 90-degree units and may output the signals LOIp', LOIn', LOQp', and LOQn'. For example, when the I+ local oscillation signal LOIp, the Q+ local oscillation signal LOQp, the I− local oscillation signal LOIn, and the Q− local oscillation signal LOQn are input to the first to fourth buffer paths P1 to P4 in order, as there is no phase different between the I+ local oscillation signal LOIp input to the activated first buffer path P1 and the I+ local oscillation signal LOIp' determined as an output signal out, the phase-shifting of the I+ local oscillation signal LOIp may not occur. Also, as a phase difference between the Q+ local oscillation signal LOQp input to the activated second buffer path P2 and the I+ local oscillation signal LOIp' determined as an output signal out is 90 degrees, the I+ local oscillation signal LOIp' may be phase-shifted by 90 degrees. In other exemplary embodiments, the LO multiplexing unit 600 may occur the phase-shifting of an output signal out by the method the same as described above, which may be easily derived from the exemplary embodiments described with reference to FIGS. 5 to 7D.

For ease of description, referring back to FIG. 3, a transmitter circuit 330 may generate RF transmit signals TXp and TXn by frequency up-conversion of an I− phase baseband signal BBI' and a Q− phase baseband signal BBQ', converted to analog signals.

The transmitter circuit 330 may include a digital-analog converter 331, an analog filter 333, and a mixer 335.

The digital-analog converter 331 may convert an I− phase baseband signal BBI and a Q− phase baseband signal BBQ output from a modulator 311 to analog signals.

The analog filter 333 may perform the frequency-filtering of the I− phase baseband signal BBI' and the Q− phase baseband signal BBQ' converted to analog signals. In an exemplary embodiment, the analog filter 333 may include a low pass filter (LPF).

The mixer 335 may perform up-conversion of frequencies of a plurality of baseband signals BBI' and BBQ' received from the analog filter 333 using the plurality of local oscillation signals LOIp', LOIn', LOQp', and LOQn' received from the local oscillation signal generator 320.

In an exemplary embodiment, the mixer 335 may perform a mixing operation using the plurality of phase-shifted plurality of local oscillation signals LOIp', LOIn', LOQp', and LOQn', thereby providing a phase-shifting function with respect to the RF signals TXp and TXn, output signals. For example, the mixer 335 may perform a mixing operation using the plurality of local oscillation signals LOIp', LOIn', LOQp', and LOQn' phase-shifted by 90-degree units by the local oscillation signal generator 320, thereby generating the RF signals TXp and TXn each having a phase-shift of 90-degree units.

In an exemplary embodiment, the mixer 335 may perform a mixing operation by combining the plurality of baseband signals BBI' and BBQ' received from the analog filter 333, thereby providing a phase-shifting function with respect to the RF signals TXp and TXn, output signals. For example, the mixer 335 may perform a mixing operation using a signal obtained by combining $$\frac{1}{\sqrt{2}}$$

times the I+ baseband signal BBIp' and $$\frac{1}{\sqrt{2}}$$

times the Q+ baseband signal BBQp', received from the analog filter 333, thereby generating the first and second RF signals TXp and TXn each having a phase-shift of 45 degrees.

In this case, the first RF signal TXp output from the mixer 335 may be transferred to a first transmit amplifier 341. The first transmit amplifier 341 may amplify the first RF signal TXp and may output the amplified first RF signal TXp to an antenna 350. Also, the second RF signal TXn output from the mixer 335 may be transferred to a second transmit amplifier 343. The second transmit amplifier 343 may amplify the second RF signal TXn and may output the amplified second RF signal TXn to the antenna 350. The first RF signal TXp and the second RF signal TXn may have a phase different of 180 degrees therebetween.

In an exemplary embodiment, the first and second transmit amplifiers 341 and 343 may include a power amplifier.

The antenna 350 may externally transmit the first and second RF signals TXp and TXn transferred from the transmitter circuit 330 through the first and second transmit amplifiers 341 and 343. The antenna 350 may transmit the first and second RF signals TXp and TXn as omnidirectional signals, or may form at least one beam B1 to B3 having directivity using the first and second RF signals TXp and TXn and may transmit (beamforming) the beam in a certain direction.

The antenna 350 may be implemented as an array antenna to perform beamforming. The array antenna may include a plurality of antenna elements 351, and a communications device 300 may selectively activate the plurality of antenna elements 351 and may perform beamforming. FIG. 3 illustrates the example in which the antenna 350 is implemented as a planar array antenna, but an exemplary embodiment thereof is not limited thereto. For example, the antenna 350 may have various structures, a linear array antenna, or the like.

The plurality of RF signals RXp and RXn received from an external entity through the antenna 350 may be amplified by receive amplifiers 361 and 363, and may be transferred to a receiver circuit 370. For example, the first RF signal RXp received through the antenna 350 may be amplified by the first receive amplifier 361, and may be transferred to the receiver circuit 370. Also, the second RF signal RXn received through the antenna 350 may be amplified by the second receive amplifier 363, and may be transferred to the receiver circuit 370. The first RF signal RXp and the second RF signal RXn may have a phase difference of 180 degrees.

In an exemplary embodiment, the first receive amplifier 361 and the second receive amplifier 363 may include a low noise amplifier (LNA).

The receiver circuit 370 may include a mixer 371, an analog filter 373, and an analog-digital converter 375.

The mixer 371 may perform frequency down-conversion of the plurality of RF signals RXp and RXn received from the receive amplifiers 361 and 363 using the plurality of local oscillation signals LOIp', LOIn', LOQp', and LOQn' received from the local oscillation signal generator 320, thereby generating a plurality of baseband signals RBBI and RBBQ. The generated baseband signals RBBI and RBBQ may be quadrature signals, may include an I– phase baseband signal RBBIp and RBBIn and a Q– phase baseband signal RBBQp and RBBQn.

The analog filter 373 may perform a frequency filtering operation with respect to the baseband signals RBBI and RBBQ received from a mixer 371. In an exemplary embodiment, the analog filter 373 may include a low pass filter (LPF).

The analog-digital converter 375 may convert the baseband signals RBBI and RBBQ to digital signals. The baseband signals RBBI' and RBBQ' converted to digital signals may be transferred to a multiplexer 313 and may be recovered to a receive bitstream through a multiplexing process.

In the description below, a mixer will be described in greater detail in accordance with an exemplary embodiment with reference to FIGS. 9 to 11.

Figure 9:
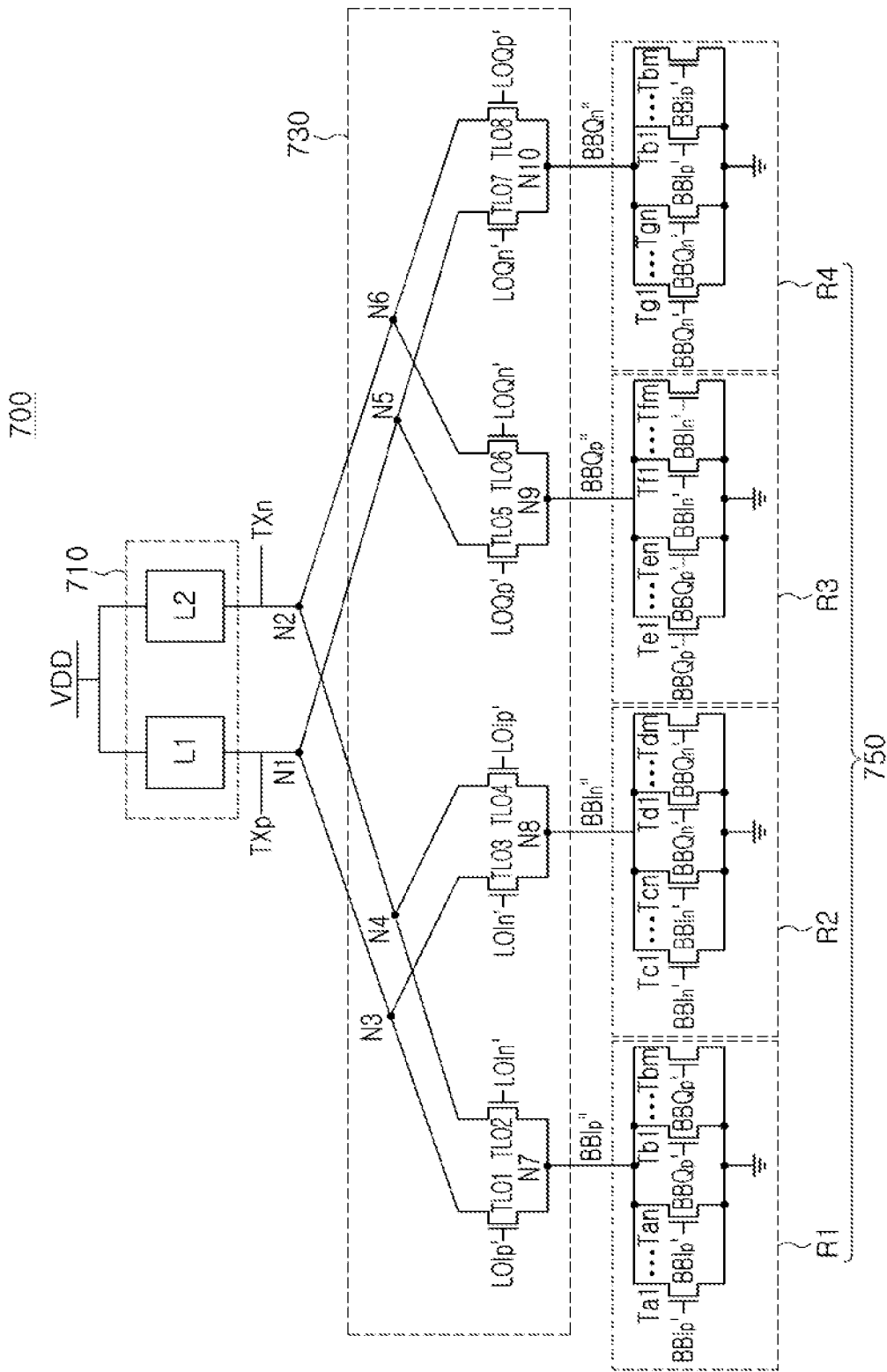
FIG. 9 is a circuit diagram illustrating a structure of a mixer according to an exemplary embodiment of the present inventive concept.
Figure 10A:
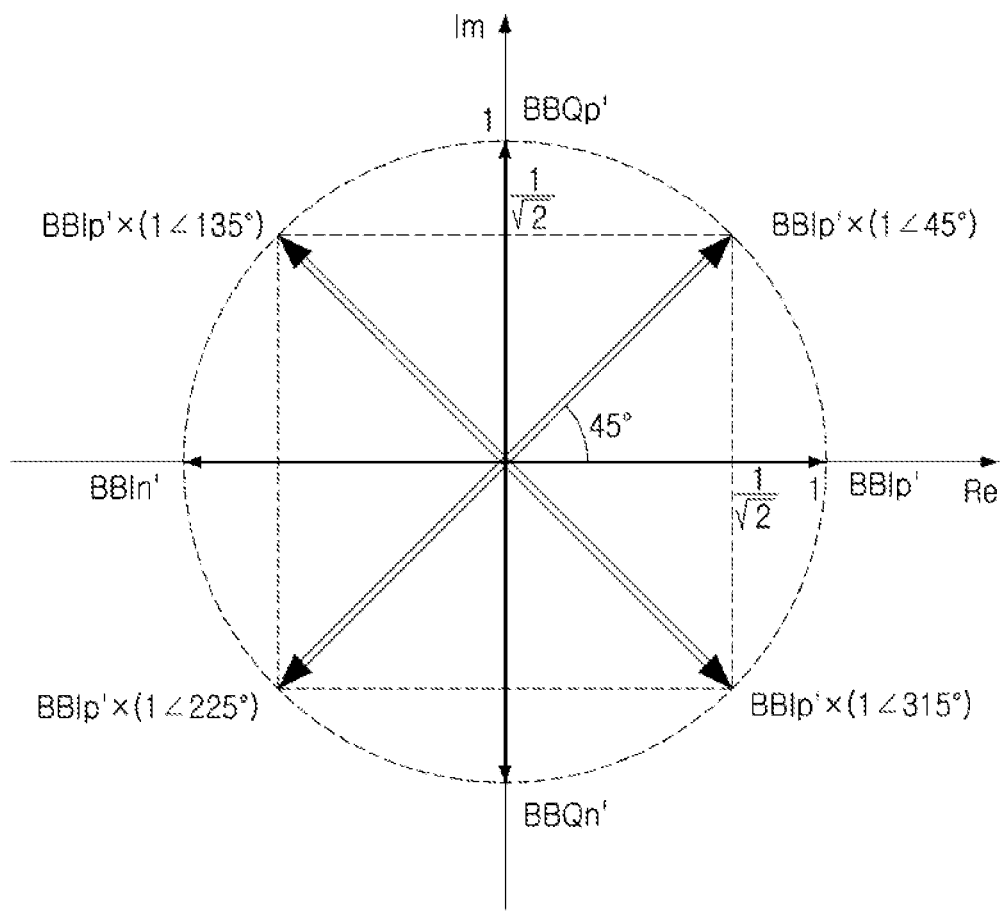
FIGS. 10A and 10B are phase diagrams illustrating a method of collecting baseband signals and performing phase-shifting by a mixer according to an exemplary embodiment of the present inventive concept.
Figure 10B:
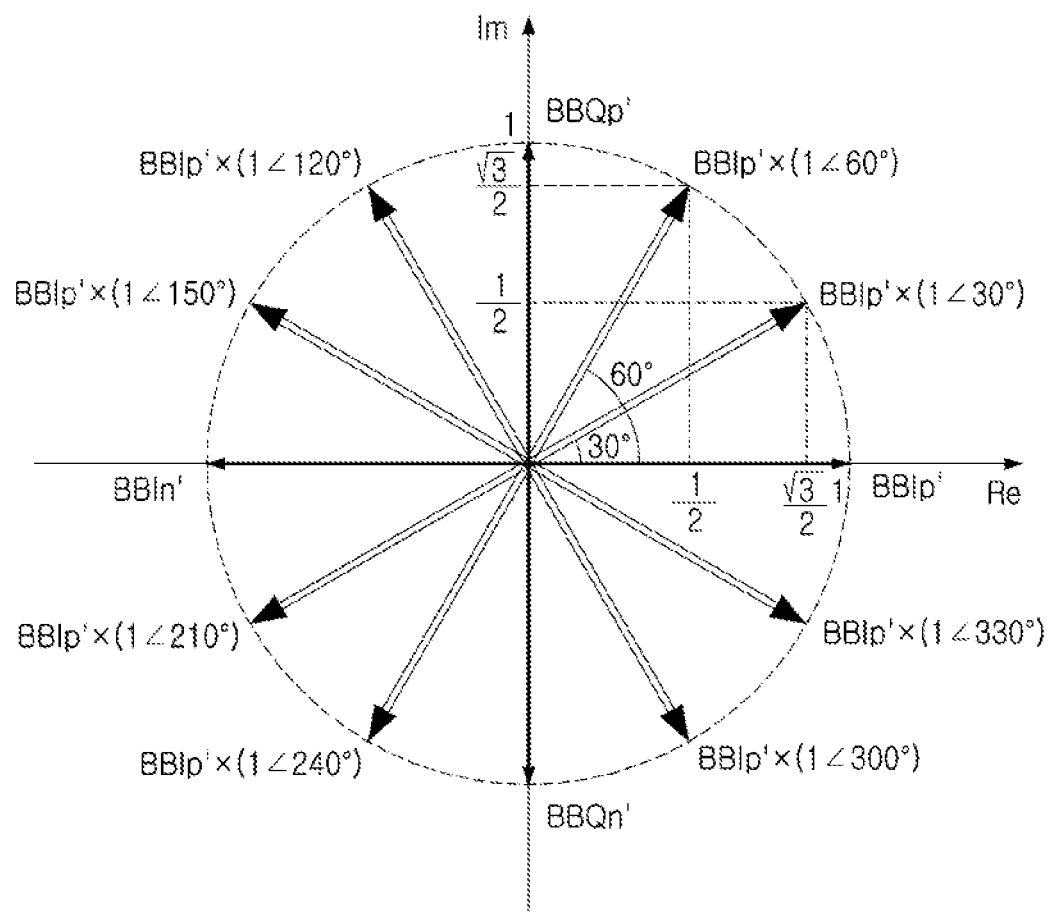

FIG. 9 illustrates a structure of a mixer according to an exemplary embodiment of the present disclosure. FIGS. 10A and 10B illustrate a method of collecting baseband signals and performing phase-shifting by a mixer according to an exemplary embodiment of the present disclosure.

Referring to FIG. 9, a mixer 700 may include a load portion 710, a first switching unit 730 performing a switching operation in response to local oscillation signals LOIp', LOIn', LOQp', and LOQn', and a second switching unit 750 performing a switching operation in response to baseband signals BBIp', BBIn', BBQp', and BBQn'.

The load portion 710 may be connected between an input node and output nodes N1 and N2 of a first power voltage VDD and may adjust a magnitude of an RF signal. The load portion 710 may include a first load L1 connected between the input node and a first output node N1 of the external power voltage VDD, and a second load L2 connected between the input node and a second output node N2 of the external power voltage VDD.

When a communications device performs wireless communications using a millimeter wave (mmWave), the first load L1 and the second load L2 may be implemented as inductors. In an exemplary embodiment, inductance of the first load L1 and the second load L2 may be 0.1 nH or higher and 0.5 nH or lower, respectively.

When the communications device performs wireless communications using a wave of terahertz band, the first load L1 and the second load L2 may be implemented as microstrip lines.

The first switching unit 730 may perform a switching operation using the local oscillation signals LOIp', LOIn', LOQp', and LOQn' phase-shifted to a first phase value by an LO multiplexing unit, thereby phase-shifting first and second RF signals TXp and TXn output through the first and second output nodes N1 and N2 by the first phase value. In an exemplary embodiment, the first phase value may be in increments of 90-degree unit values, including 0 degrees, 90 degrees, 180 degrees, and 270 degrees, for example.

The first switching unit 730 may include first to eighth LO transistors TLO1 to TLO8. The first to eighth LO transistors TLO1 to TLO8 may be implemented as PMOS transistors or NMOS transistors, or the like.

The first LO transistor TLO1 may be connected between a third node N3 and a seventh node N7, and may perform a switching operation in response to an I+ oscillation signal LOIp' input to a gate terminal. The second LO transistor TLO2 may be connected between a fourth node N4 and a seventh node N7, and may perform a switching operation in response to an I– oscillation signal LOIn' input to a gate terminal. The third LO transistor TLO3 may be connected between a third node N3 and an eighth node N8, and may perform a switching operation in response to an I– oscillation signal LOIn' input to a gate terminal. The fourth LO transistor TLO4 may be connected between the fourth node N4 and the eighth node N8, and may perform a switching operation in response to an I+ oscillation signal LOIp' input to a gate terminal.

The fifth LO transistor TLO5 may be connected between a fifth node N5 and a ninth node N9, and may perform a switching operation in response to a Q+ oscillation signal LOQp' input to a gate terminal. The sixth LO transistor TLO6 may be connected between the sixth node N6 and the ninth N9, and may perform a switching operation in accordance with a Q– local oscillation signal LOQn' input to a gate terminal. The seventh LO transistor TLO7 may be connected between the fifth node N5 and a tenth node N10, and may perform a switching operation in accordance with a Q– local oscillation signal LOQn' input to a gate terminal. The eighth LO transistor TLO8 may be connected between the sixth node N6 and the tenth node N10, and may perform a switching operation in accordance with a Q+ local oscillation LOQp' input to a gate terminal.

The second switching unit 750 may perform a switching operation in accordance with combination of the plurality of baseband signals BBIp', BBIn', BBQp', and BBQn', thereby phase-shifting the first and second RF signals TXp and TXn output through the first and second output nodes N1 and N2 to a second phase value. In an exemplary embodiment, the second phase value may be a value equal to or lower than 45 degrees, such as 45 degrees, 30 degrees, or the like, for example.

The second switching unit 750 may include first to fourth branches R1 to R4 each including a plurality of transistors.

The plurality of transistors included in the second switching unit 750 may be PMOS transistors or NMOS transistors, or the like.

A first branch R1 may include a plurality of first I– phase transistors Ta1 to Tan (n is a natural number) and a plurality of first Q– phase transistors Tb1 to Tbm (m is a natural number), connected in parallel between a seventh node N7 and an input node of a second power voltage, lower than the first power voltage VDD, such as a ground voltage terminal, for example. The first I– phase transistors Ta1 to Tan may perform a switching operation in response to an I+ baseband signal BBIp' input to a gate terminal of each of the plurality of first I– phase transistors Ta1 to Tan. The first Q– phase transistors Tb1 to Tbn may perform a switching operation in response to a Q+ baseband signal BBQp' input to a gate terminal of each of the first Q– phase transistors Tb1 to Tbn.

The I+ baseband signal BBIp' and the Q+ baseband signal BBQp' input to a plurality of transistors of the first branch R1 may be coupled to each other in accordance with the switching operations of the first and second LO transistors TLO1 and TLO2 connected to the seventh node N7. Accordingly, an I+ baseband signal BBIp" phase-shifted to a second phase value may be output from the plurality of transistors of the first branch R1.

The second branch R2 may include a plurality of second I– phase transistors Tc1 to Tcn and a plurality of second Q– phase transistors Td1 to Tdm connected in parallel between the eighth node N8 and an input node of the second power voltage, such as a ground terminal, for example. The second I– phase transistors Tc1 to Tcn may perform a switching operation in response to an I– baseband signal BBIn' input to a gate terminal of each of the second I– phase transistors Tc1 to Tcn. The second Q– phase transistors Td1 to Tdn may perform a switching operation in response to a Q– baseband signal BBQn' input to a gate terminal of each of the second Q– phase transistors Td1 to Tdn.

The I– baseband signal BBIn' and the Q– baseband signal BBQn' input to the plurality of transistors of the second branch R2 may be coupled to each other in accordance with the switching operations of the third and fourth LO transistors TLO3 and TLO4 connected to the eighth node N8. Accordingly, an I– baseband signal BBIn" phase-shifted to a second phase value may be output from the plurality of transistors of the second branch R2.

The phase-shifted I+ baseband signal BBIp" output from the first branch R1 and the phase-shifted I– baseband signal BBIn" output from the second branch R2 may have a phase difference of 180 degrees, and may therefore be combined to remove an image signal.

The third branch R3 may include a plurality of third Q– phase transistors Te1 to Ten and a plurality of third I– phase transistors Tf1 to Tfm, connected in parallel between a ninth node N9 and an input node of the second power voltage, such as a ground terminal, for example. The third Q– phase transistors Te1 to Ten may perform a switching operation in response to the Q+ baseband signal BBQp' input to a gate terminal of each of the third Q– phase transistors Te1 to Ten. The third I– phase transistors Tf1 to Tfm may perform a switching operation in response to the I– baseband signal BBIn' input to a gate terminal of each of the third I– phase transistors Tf1 to Tfm.

The Q+ baseband signal BBQp' and the I– baseband signal BBIn' input to the plurality of transistors of the second branch R2 may be coupled to each other in accordance with a switching operation of the fifth and sixth LO transistors TLO5 and TLO6 connected to the ninth node N9. Accordingly, a Q+ baseband signal BBQp" phase-shifted to a second phase value may be output from the plurality of transistors of the third branch R3.

The fourth branch R4 may include a plurality of fourth Q– phase transistors Tg1 to Tgn and a plurality of fourth I– phase transistors Th1 to Thm, connected in parallel between the tenth node N10 and an input node of the second power voltage, such as a ground terminal, for example. The fourth Q– phase transistors Tg1 to Tgn may perform a switching operation in response to the Q– baseband signal BBQn' input to a gate terminal of each of the fourth Q– phase transistors Tg1 to Tgn. The fourth I– phase transistors Th1 to Thm may perform a switching operation in response to the I+ baseband signal BBIp' input to a gate terminal of each of the fourth I– phase transistors Th1 to Thm.

The Q– baseband signal BBQn' and I+ baseband signal BBIp' input to the plurality of transistors of the fourth branch R4 may be coupled to each other in accordance with a switching operation of the seventh and eighth LO transistors TLO7 and TLO8 connected to the tenth node N10. Accordingly, a Q– baseband signal BBQn" phase-shifted to a second phase value may be output from the plurality of transistors of the fourth branch R4.

The phase-shifted Q+ baseband signal BBQp" output from the third branch R3 and the phase-shifted Q– baseband signal BBQn' output from the fourth branch R4 may have a phase difference of 180 degrees, and may therefore be combined to remove an image signal.

A method of phase-shifting of the plurality of baseband signals BBIp', BBIn', BBQp', and BBQn' performed by the first to fourth branches R1 to R4 may be the same as in FIGS. 10A and 10B.

FIG. 10A illustrates a method of phase-shifting a plurality of baseband signals BBIp', BBIn', BBQp', and BBQn' to 45 degrees.

Referring to FIG. 10A along with FIG. 9, a mixer 700 may phase-shift the plurality of baseband signals BBIp', BBIn', BBQp', and BBQn' by a certain phase value by combining a plurality of pairs of signals selected from among the plurality of baseband signals BBIp', BBIn', BBQp', and BBQn' to each other. For example, the mixer 700 may shift a phase of the I+ baseband signal BBIp' by 45 degrees (=BBIp'×1∠45°) by combining the I+ baseband signal BBIp' to the Q+ baseband signal BBQp' in same magnitude.

In an exemplary embodiment, the mixer 700 may adjust magnitudes of the plurality of baseband signals BBIp', BBIn', BBQp', and BBQn' to maintain magnitudes of the plurality of baseband signals BBIp', BBIn', BBQp', and BBQn' to be the same before and after signal conversion. For example, the mixer 700 may adjust a magnitude of each of the I+ baseband signal BBIp' and the Q+ baseband signal BBQp' to be $$\frac{\sqrt{2}}{2}$$

times and may combine the signals to each other. A combined signal BBIp" may have a magnitude the same as that of the I+ baseband signal BBIp' and a phase different from that of the I+ baseband signal BBIp' by 45 degrees (BBIp"=BBIp'×1∠45°).

In an exemplary embodiment, the mixer 700 may adjust magnitudes of the plurality of baseband signals BBIp', BBIn', BBQp', and BBQn' input to first to fourth branches R1 to R4 by controlling the number of transistors activated in each of the first to fourth branches R1 to R4. For example, to adjust a magnitude of each of the I+ baseband signal BBIp' and the Q+ baseband signal BBQp' to be $$\frac{\sqrt{2}}{2}$$

times, the mixer 700 may control the number of transistors of the plurality of transistors included in the first branches R1, which operates in response to the I+ baseband signal BBIp', and the number of transistors of the plurality of transistors included in the first branches R1, which operates in response to the Q+ baseband signal BBQp', to be number k (k is a natural number smaller than n and m).

To shift a phase of the Q+ baseband signal BBQp' by 45 degrees, the mixer 700 may adjust each of a magnitude of the Q+ baseband signal BBQp' and a magnitude of the I− baseband signal BBIn' to be $$\frac{\sqrt{2}}{2}$$

times and may combine the signals. A combined signal BBQp" may have a magnitude the same as that of the I+ baseband signal BBIp' and may have a phase different from that of the I+ baseband signal BBIp' by 135 degrees (BBQp"=BBIp'×1∠135°).

To shift a phase of the I− baseband signal BBIn' by 45 degrees, the mixer 700 may adjust each of a magnitude of the I− baseband signal BBIn' and a magnitude of the Q− baseband signal BBQn' to be $$\frac{\sqrt{2}}{2}$$

times and may combine the signals. A combined signal BBIn" may have a magnitude the same as that of the I+ baseband signal BBIp' and may have a phase different from that of the I+ baseband signal BBIp' by 225 degrees (BBIn"=BBIp'×1∠225°).

To shift a phase of the Q− baseband signal BBQn' by 45 degrees, the mixer 700 may adjust each of a magnitude of the Q− baseband signal BBQn' and a magnitude of the I+ baseband signal BBIp' to be $$\frac{\sqrt{2}}{2}$$

times and may combine the signals. A combined signal BBQn" may have a magnitude the same as that of the I+ baseband signal BBIp' and may have a phase different from that of the I+ baseband signal BBIp' by 315 degrees (BBQn"=BBIp'×1∠315°).

The mixer 700 in the exemplary embodiment may implement a phase-shift of 90-degree units by phase-shifting of the plurality of local oscillation signals LOIp, LOIn, LOQp, and LOQn and may implement a phase-shift of 45 degrees by phase-shifting of the plurality of baseband signals BBIp', BBIn', BBQp', and BBQn', thereby providing a phase-shifting function of 45-degree units (which are 0 degrees, 45 degrees, 90 degrees, 135 degrees, 180 degrees, 225 degrees, 270 degrees, and 315 degrees) with respect to an RF signal. As the mixer 700 provides a phase-shifting function with respect to an RF signal, a phase-shifter may not be necessary such that the communications device may reduce a signal reduction, an increase of a chip-area, and an increase of current consumption, caused by addition of a phase-shifter.

FIG. 10B illustrates a method of phase-shifting a plurality of transmit signals by 30 degrees and 60 degrees.

Referring to FIG. 10B along with FIG. 9, a mixer 700 may shift phases of a plurality of baseband signals BBIp', BBIn', BBQp', and BBQn' by a certain phase value by combining a plurality of pairs of signals selected from among the plurality of baseband signals BBIp', BBIn', BBQp', and BBQn'. For example, the mixer 700 may adjust a magnitude of the I+ baseband signal BBIp' and a magnitude of the Q+ baseband signal BBQp' in certain ratio and may combine the signals, thereby shifting a phase of the I+ baseband signal BBIp' by 30 degrees (=BBIp'×1∠30°).

In an exemplary embodiment, the mixer 700 may adjust magnitudes of the plurality of baseband signals BBIp', BBIn', BBQp', and BBQn' to maintain the magnitudes of the plurality of baseband signals BBIp', BBIn', BBQp', and BBQn' to be the same before and after combination. For example, to shift only a phase of the I+ baseband signal BBIp' by 30 degrees, the mixer 700 may adjust a magnitude of the I+ baseband signal BBIp' to be $$\frac{\sqrt{3}}{2}$$

times and may adjust a magnitude of the Q+ baseband signal BBQp' to be $$\frac{\sqrt{2}}{2}$$

times, and may combine the signals. A combined signal BBIp" may have a magnitude the same as that of the I+ baseband signal BBIp' and a phase different from that of the I+ baseband signal BBIp' by 30 degrees (BBIp"=BBIp'×1∠30°).

In an exemplary embodiment, the mixer 700 may adjust magnitudes of the plurality of baseband signals BBIp', BBIn', BBQp', and BBQn' input to first to fourth branches R1 to R4, respectively, by controlling the number of transistors activated in each of the first to fourth branches R1 to R4.

To shift a phase of the I+ baseband signal BBIp' by 60 degrees, the mixer 700 may adjust a magnitude of the I+ baseband signal BBIp' to be ½ times and may adjust a magnitude of the Q+ baseband signal BBQp' to be $$\frac{\sqrt{3}}{2}$$

times, and may combine the signals. A combined signal BBQp" may have a magnitude the same as that of the I+ baseband signal BBIp' and a phase different from that of the I+ baseband signal BBIp' by 60 degrees (BBIp"=BBIp'×1∠60°).

To shift a phase of the Q+ baseband signal BBQp' by 30 degrees, the mixer 700 may adjust a magnitude of the Q+ baseband signal BBQp' to be $$\frac{\sqrt{3}}{2}$$

times and may adjust a magnitude of the I− baseband signal BBIn' to be ½ times, and may combine the signals. A combined signal BBQp″ may have a magnitude the same as that of the I+ baseband signal BBIp' and a phase different from that of the I+ baseband signal BBIp' by 120 degrees (BBQp″=BBIp'×1∠120°).

To shift a phase of the Q+ baseband signal BBQp' by 60 degrees, the mixer 700 may adjust a magnitude of the Q+ baseband signal BBQp' to be ½ times and may adjust a magnitude of the I− baseband signal BBIn' to be $$\frac{\sqrt{3}}{2}$$

times, and may combine the signals. A combined signal BBQp″ may have a magnitude the same as that of the I+ baseband signal BBIp' and a phase different from that of the I+ baseband signal BBIp' by 150 degrees (BBQp″=BBIp'×1∠150°).

To shift a phase of the I− baseband signal BBIn' by 30 degrees, the mixer 700 may adjust a magnitude of the I− baseband signal BBIn' to be $$\frac{\sqrt{3}}{2}$$

times and may adjust a magnitude of the Q− baseband signal BBQn' to be ½ times, and may combine the signals. A combined signal BBIn″ may have a magnitude the same as that of the I+ baseband signal BBIp' and a phase different from that of the I+ baseband signal BBIp' by 210 degrees (BBIn″=BBIp'×1∠210°).

To shift a phase of the I− baseband signal BBIn' by 60 degrees, the mixer 700 may adjust a magnitude of the I− baseband signal BBIn' to be ½ times and may adjust a magnitude of the Q− baseband signal BBQn' to be $$\frac{\sqrt{3}}{2}$$

times, and may combine the signals. A combined signal BBIn″ may have a magnitude the same as that of the I+ baseband signal BBIp' and a phase different from that of the I+ baseband signal BBIp' by 240 degrees (BBIn″=BBIp'× 1∠240°).

To shift a phase of the Q− baseband signal BBQn' by 30 degrees, the mixer 700 may adjust a magnitude of the Q− baseband signal BBQn' to be $$\frac{\sqrt{3}}{2}$$

times and may adjust a magnitude of the I+ baseband signal BBIp' to be ½ times, and may combine the signals. A combined signal BBQn″ may have a magnitude the same as that of the I+ baseband signal BBIp' and a phase different from that of the I+ baseband signal BBIp' by 300 degrees (BBQn″=BBIp'×1∠300°).

To shift a phase of the Q− baseband signal BBQn' by 60 degrees, the mixer 700 may adjust a magnitude of the Q− baseband signal BBQn' to be ½ times and may adjust a magnitude of the I+ baseband signal BBIp' to be $$\frac{\sqrt{3}}{2}$$

times, and may combine the signals. A combined signal BBQn″ may have a magnitude the same as that of the I+ baseband signal BBIp' and a phase different from that of the I+ baseband signal BBIp' by 330 degrees (BBQn″=BBIp'× 1∠330°).

The mixer 700 in the exemplary embodiment may implement a phase-shift of 90-degree units by phase-shifting of the plurality of local oscillation signals LOIp, LOIn, LOQp, and LOQn and may implement a phase-shift of 30 degrees and 60 degrees by phase-shifting of the plurality of baseband signals BBIp', BBIn', BBQp', and BBQn', thereby providing a phase-shifting function of 30-degree units (which are 0 degrees, 30 degrees, 60 degrees, 90 degrees, 120 degrees, 150 degrees, 180 degrees, 210 degrees, 240 degrees, 270 degrees, 300 degrees, 330 degrees, and 360 degrees) with respect to an RF signal.

FIGS. 10A and 10B illustrates the example in which the mixer 700 may provide a phase-shifting function of 45-degree units and 30-degree units with respect to an RF signal, but an exemplary embodiment thereof is not limited thereto. Alternatively, the mixer 700 in the exemplary embodiment may provide a phase-shifting function of 45 or below degree units, 20-degree units, for example.

In the description below, a structure of a mixer 371 included in a receiver circuit 370 will be described in greater detail with reference to FIG. 11.

Figure 11:
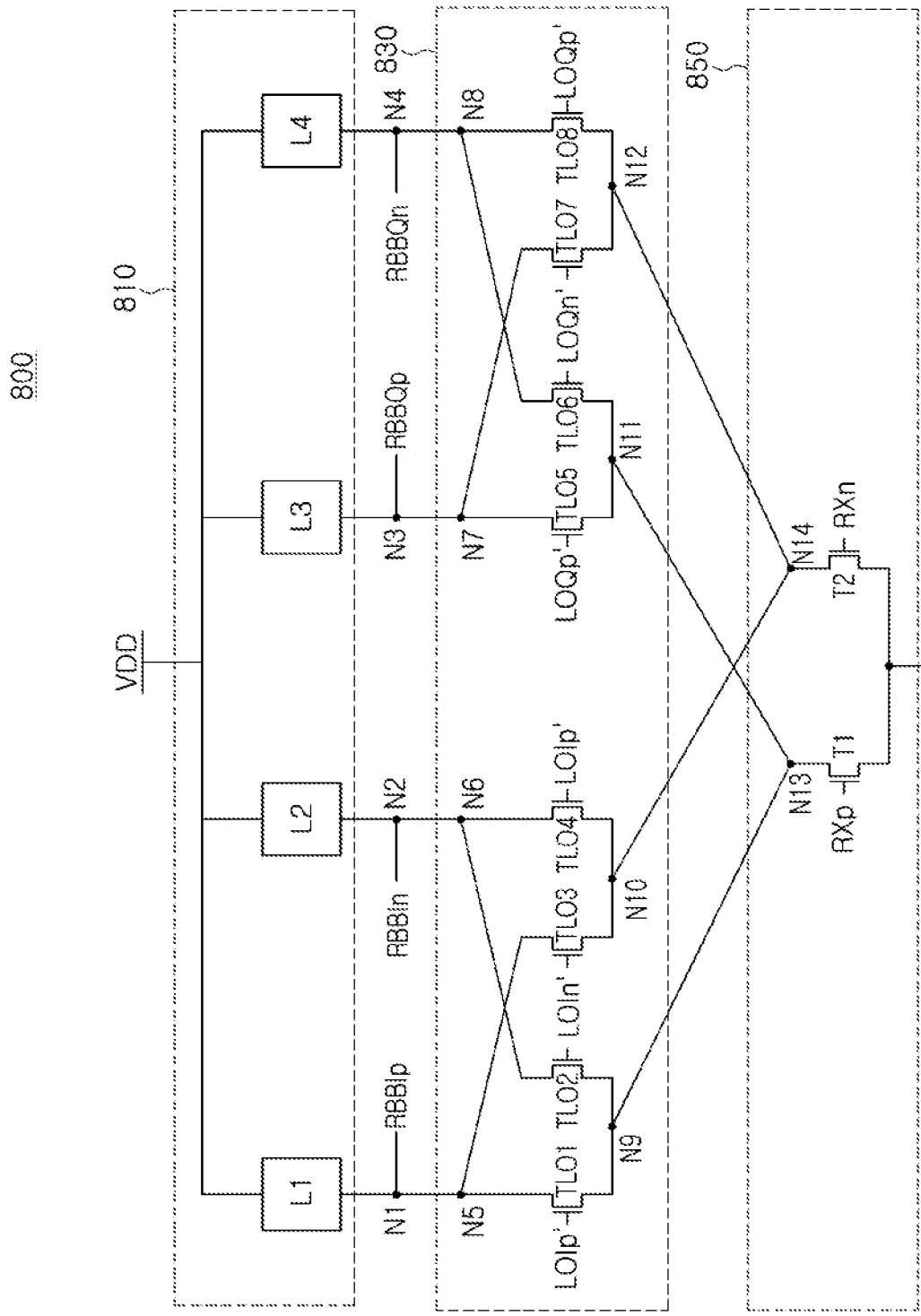
FIG. 11 is a circuit diagram illustrating a structure of a mixer according to an exemplary embodiment of the present inventive concept.

FIG. 11 illustrates a mixer according to an exemplary embodiment of the present disclosure.

Referring to FIG. 11, a mixer 800 may include a load portion 810, a first switching unit 830, and a second switching unit 850.

The load portion 810 may be connected between an input node and a plurality of output nodes N1 to N4 of a first power voltage VDD and may generate a receive baseband signal RBBIp in accordance with of a switching operation of the first switching unit 830 and the second switching unit 850.

The load portion 810 may include first to fourth loads L1 to L4 connected between an input node of the first power voltage VDD and the first to fourth nodes N1 to N4, respectively. In an exemplary embodiment, when a communications device including the mixer 800 performs wireless communications using a millimeter wave (mmWave), the first to fourth nodes N1 to N4 may be implemented as inductive devices. In this case, an inductance value of each of the first to fourth nodes N1 to N4 may be 0.1 nH or higher and 0.5 nH or lower. In an exemplary embodiment, when the communications device including the mixer 800 performs wireless communications using waves of terahertz, the first to fourth nodes N1 to N4 may be implemented as microstrip lines.

The first switching unit 830 may include first to eighth LO transistors TLO1 to TLO8 performing a switching operation in response to a plurality of local oscillation signals LOIp', LOIn', LOQp', and LOQn'. The first to eighth LO transistors TLO1 to TLO8 may be PMOS transistors or NMOS transistors.

The first LO transistor TLO1 may be connected between the fifth node N5 and the ninth node N9, and may perform a switching operation in response to the I+ local oscillation signal LOIp' input to a gate. The second LO transistor TLO2 may be connected between the sixth node N6 and the ninth node N9, and may perform a switching operation in response to the I− local oscillation signal LOIn' input to a gate. The third LO transistor TLO3 may be connected between the fifth node N5 and the tenth node N10, and may perform a switching operation in response to the I− local oscillation signal LOIn' input to a gate. The fourth LO transistor TLO4 may be connected between the sixth node N6 and the tenth node N10, and may perform a switching operation in response to the I+ local oscillation signal LOIp' input to a gate.

The fifth LO transistor TLO5 may be connected between the seventh node N7 and the eleventh node N11, and may perform a switching operation in response to the Q+ local oscillation signal LOQp' input to a gate. The sixth LO transistor TLO6 may be connected to the eighth node N8 and the eleventh node N11, and may perform a switching operation in response to the Q− local oscillation signal LOQn' input to a gate. The seventh LO transistor TLO7 may be connected between the seventh node N7 and the twelfth node N12, and may perform a switching operation in response to the Q− local oscillation signal LOQn' input to a gate. The eighth LO transistor TLO8 may be connected to the eighth node N8 and the twelfth node N12, and may perform a switching operation in response to the Q+ local oscillation signal LOQp' input to a gate.

The second switching unit 850 may include first and second transistors T1 and T2 performing a switching operation in response to a plurality of RF receive signals RXp and RXn. The first and second transistors T1 and T2 may be PMOS transistors or NMOS transistors.

The first transistor T1 may be connected between the thirteenth node N13 and an input node of a second power voltage, lower than the first power voltage VDD, a ground terminal, for example, and may perform a switching operation in response to the first RF receive signal RXp input to a gate. The second transistor T2 may be connected between the fourteenth node N14 and an input node of a second power voltage, and may perform a switching operation in response to the second RF receive signal RXn.

The mixer 800 may perform an operation of mixing the plurality of local oscillation signals LOIp', LOIn', LOQp', and LOQn' and the receive signals RXp and RXn in accordance with the switching operations of the first switching unit 830 and the second switching unit 850, and may generate a plurality of baseband signals RBBIp, RBBIn, RBBQp, and RBBQn. In an exemplary embodiment, the I+ baseband signal RBBIp, the I− baseband signal RBBIn, the Q+ baseband signal RBBQp, and the Q− baseband signal RBBQn may be output through the first to fourth nodes N1 to N4, respectively.

In the description below, a method of performing wireless communications by a communications device will be described in accordance with an exemplary embodiment with reference to FIGS. 12 and 13.

Figure 12:
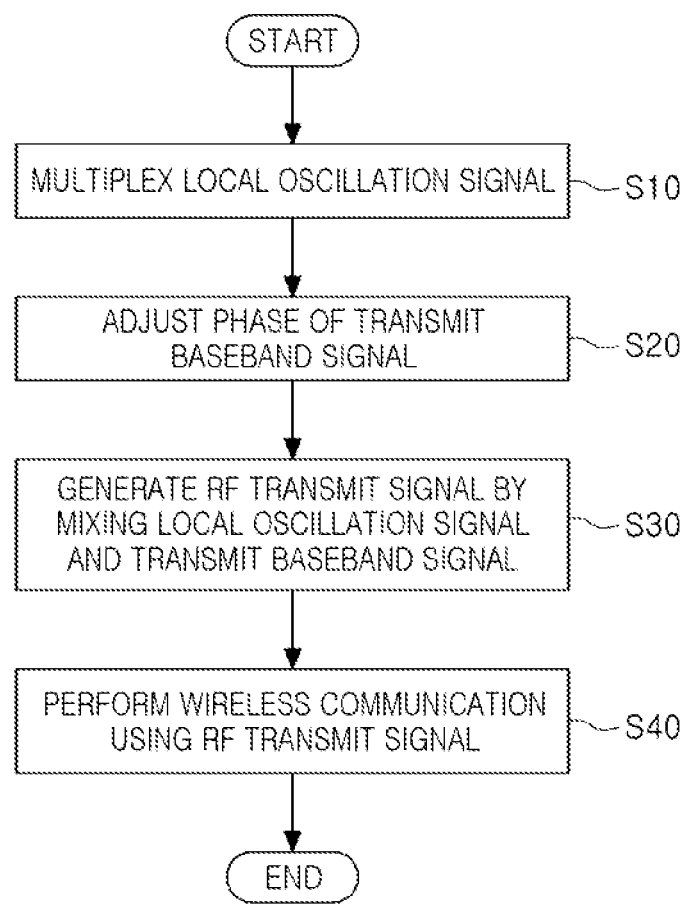
FIG. 12 is a flowchart diagram illustrating a method of operating a communications device according to an exemplary embodiment of the present inventive concept.

FIG. 12 illustrates a method of transmitting an RF signal by a communications device according an exemplary embodiment of the present disclosure.

Referring to FIG. 12, in operation S10, the communications device may multiplex a local oscillation signal generated by a local oscillator and may shift a phase of the local oscillation signal. In an exemplary embodiment, the communications device may include a local oscillation (LO) multiplexing unit for multiplexing a local oscillation signal, and the LO multiplexing unit may include a multiplexer and an LO buffer including a plurality of buffer paths. The detailed description of the LO multiplexing unit is the same as in the exemplary embodiments described with reference to FIGS. 4 to 8.

In operation S20, the communications device may shift phases of a plurality of transmit baseband signals by combining the plurality of transmit baseband signals generated from a certain transmit bitstream and input to a mixer. In an exemplary embodiment, the communications device may adjust a shifted phase value by adjusting magnitudes of the transmit baseband signals to be combined. For example, the communications device may generate a phase-shift of 45 degrees by combining two transmit baseband signals intersecting each other in the same magnitude. Also, the communications device may differently adjust magnitudes of two transmit baseband signals intersecting each other to be $$\frac{\sqrt{3}}{2}$$

times and ½ times, thereby generating a phase-shift of 30 degrees or 60 degrees.

In operation S30, the communications device may generate a plurality of RF transmit signals by frequency up-conversion of the phase-shifted transmit baseband signals using phase-shifted local oscillation signals. In an exemplary embodiment, the plurality of RF transmit signals may include a first RF transmit signal and a second RF transmit signal having a phase difference of 180 degrees therebetween.

In operation S40, the communications device may perform wireless communications using the plurality of RF transmit signals generated in the operation S30. In an exemplary embodiment, the communications device may perform transmit-beamforming by forming at least one beam using the plurality of RF transmit signals.

Figure 13:
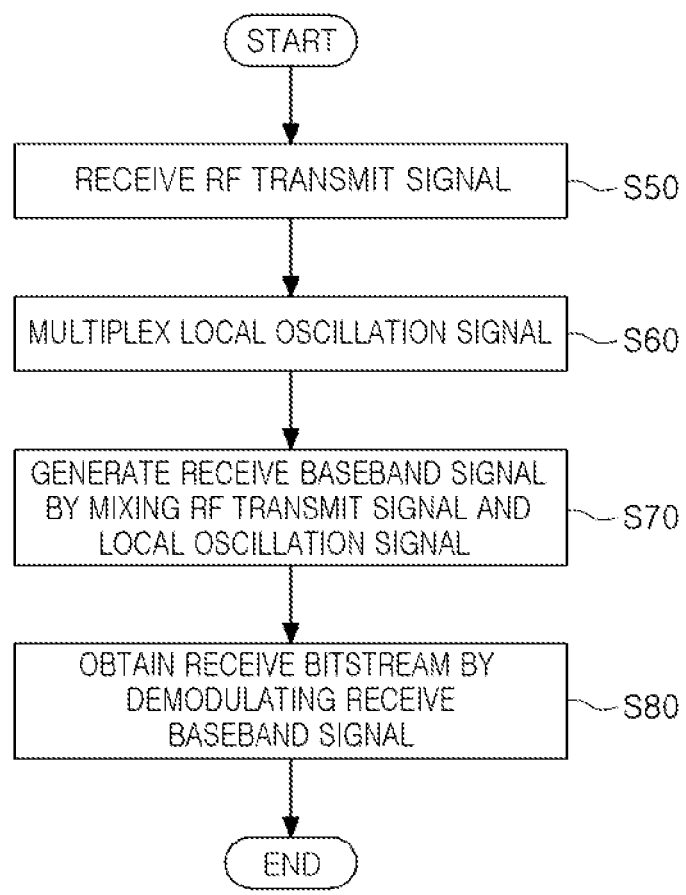
FIG. 13 is a flowchart diagram illustrating a method of operating a communications device according to an exemplary embodiment of the present inventive concept.

FIG. 13 illustrates a method of receiving an RF signal by a communications device accordance with an exemplary embodiment of the present disclosure.

Referring to FIG. 13, in operation S50, the communications device may receive an RF transmit signal from an external entity through an antenna. In an exemplary embodiment, the communications device may perform receive-beamforming and may receive at least one beam.

In operation S60, the communications device may multiplex a local oscillation signal generated by a local oscillator and may phase-shift a phase of a local oscillation signal. In an exemplary embodiment, the communications device may include an LO multiplexing unit for multiplexing the local oscillation signal.

In operation S70, the communications device may generate a plurality of baseband signals by frequency down-conversion of an RF receive signal using the local oscillation signal phase-shifted in the operation S60. In an exemplary embodiment, the plurality of baseband signals may be quadrature signals including in-phase signals and quadrature phases.

In operation S80, the communications device may multiplex the plurality of baseband signals generated in the operation S70 and may obtain a certain receive bitstream.

The communications device described in the aforementioned exemplary embodiments with reference to FIGS. 1 to 13 may perform a phase-shifting function through a mixer without a phase-shifter, thereby reducing a signal reduction, an increase of a chip area, and an increase of current consumption.

Figure 14:
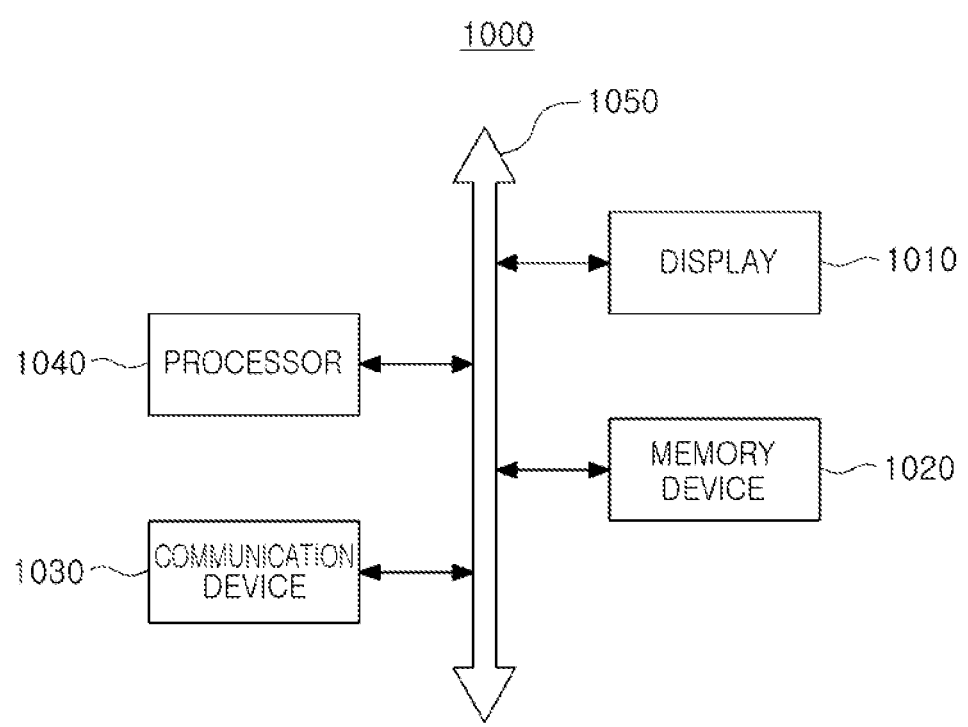
FIG. 14 is a schematic diagram illustrating an electronic device including a communications device according to an exemplary embodiment of the present inventive concept.

FIG. 14 illustrates an electronic device including a communications device according to an exemplary embodiment of the present disclosure.

Referring to FIG. 14, an electronic device 1000 may include a display 1010, a memory device 1020, a communications device 1030, a processor 1040, and others.

The electronic device 1000 may include a smartphone, a tablet PC, a smart wearable device, or the like.

The display 1010 may include an organic light emitting diode (OLED), a liquid crystal display (LCD), a plasma display panel (PDP), or the like, and may display various images on a screen. The display 1010 may also provide a user interface function. For example, the display 1010 may provide a means for inputting various commands by a user.

The memory device 1020 may be a storage medium for storing data, multimedia data, or the like, required for operation of the electronic device 1000. The memory device 1020 may include a storage device based on a semiconductor device. For example, the memory device 1020 may include a dynamic random access memory device such as a DRAM, a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3 SDRAM, a DDR4 SDRAM, or the like, or a resistive memory device such as a phase change random access memory (PRAM), a magnetic random access memory (MRAM), a resistive random access memory (RRAM), or the like.

The memory device 1020 may be implemented by a storage device, and may include at least one of a solid-state drive (SSD), a hard disk drive (HDD), and an optical drive (ODD).

The communications device 1030 may include communications devices described in the exemplary embodiments with reference to FIGS. 1 to 13. For example, as the communications device 1030 includes a mixer performing a phase-shifting function, performance deterioration such as an increase of signal loss, a decrease of a gain, an increase of current consumption, an increase of a chip area, or the like, caused by including a separate phase shifter, may be prevented.

The processor 1040 may perform a calculation or a command word, a task, or the like. The processor 1040 may be a central processing unit (CPU) or a microprocessor unit (MCU), a system on chip (SoC), or the like, and may exchange various data with the display 1010, the memory device 1020, and the communications device 1030 through a bus 1050.

Figure 15:
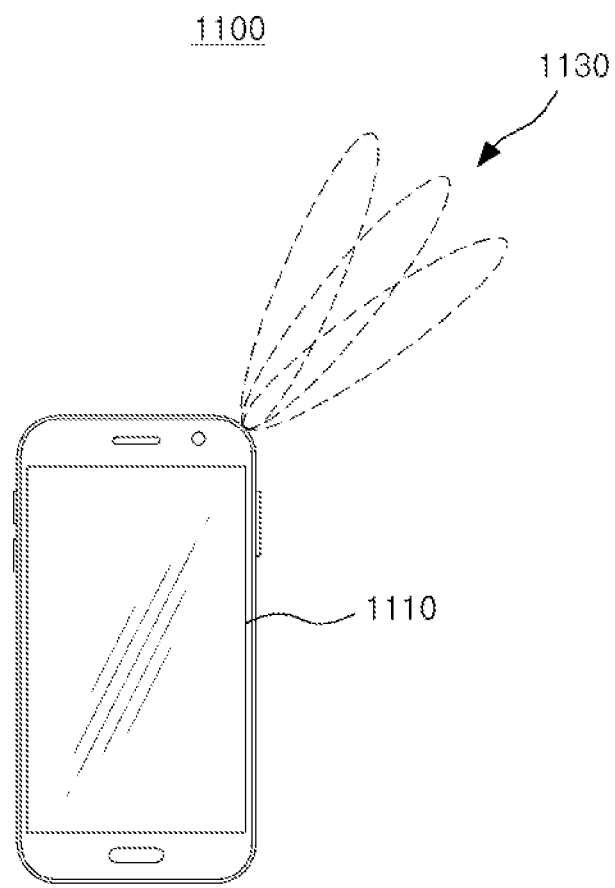
FIG. 15 is a conceptual diagram illustrating an application of a communications device according to an exemplary embodiment of the present inventive concept.
Figure 16:
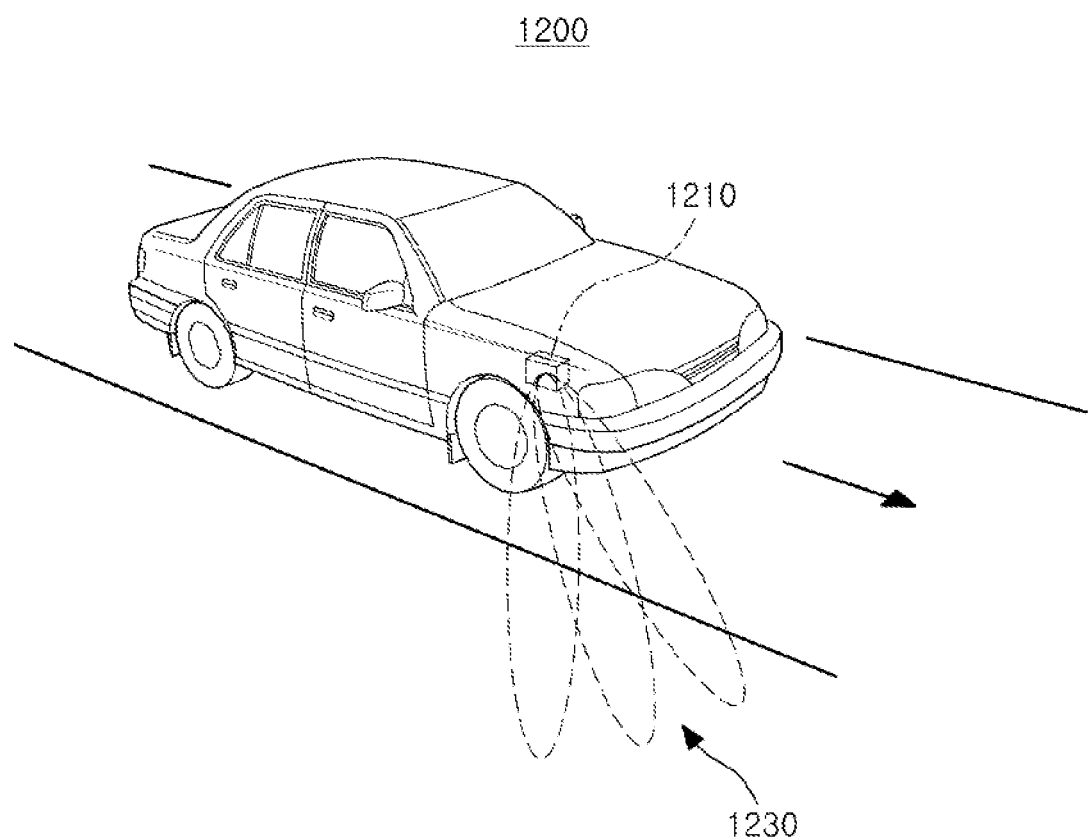
FIG. 16 is a conceptual diagram illustrating an application of a communications device according to an exemplary embodiment of the present inventive concept.

FIGS. 15 and 16 illustrate application examples of a communications device according to an exemplary embodiment of the present disclosure.

Referring to FIG. 15, a communications device in the exemplary embodiment may be mounted on a smartphone 1100 and may provide a wireless communications function.

The smartphone 1100 may include a body 1110 having a displaying function and a housing forming an exterior of the smartphone 1100 and providing a supporting function. A display may be arranged on an externally exposed front side of the body 1110, and various information and images may be displayed on the display.

The communications device may be disposed in the smartphone 1100, and an antenna of the communications device may be disposed on each of corner regions of the smartphone 1100. In an exemplary embodiment, the communications device may include an array antenna including a plurality of antenna elements. The communications device may perform transmit-beamforming by forming at least one beam 1130 having certain directivity and emitting the formed beam 1130 through the array antenna.

Referring to FIG. 16, the communications device in the exemplary embodiment may be disposed in a vehicle 1200, in an engine room 1210, for example, and may provide a wireless communications function.

The vehicle 1200 may perform a self-driving function using the communications device. In this case, the communications device disposed in the vehicle 1200 may sense a traffic lane and may determine whether the vehicle 1200 deviates from a traffic lane by performing beamforming using at least one beam 1230.

According to the aforementioned exemplary embodiments, a mixer may perform frequency up-conversion of a plurality of baseband signals using a plurality of phase-shifted local oscillation signals, thereby generating phase-shifted RF signals.

Also, the mixer may generate the phase-shifted RF signals by combining the plurality of baseband signals.

Further, the mixer may perform the phase-shifting of an RF signal in a local oscillation signal area and a baseband signal area in a divided manner, thereby simplifying a circuit structure and reducing power consumption and a chip area.

Also, according to the aforementioned exemplary embodiments, the communications device may perform the multiplexing of all signals on a local oscillation (LO) buffer terminal before a mixer and a source terminal of a baseband signal, thereby reducing signal loss on a main signal path and increasing a gain.

While exemplary embodiments have been shown and described above, it will be apparent to those of ordinary skill in the pertinent art that various substitutions, modifications and variations may be made without departing from the scope or spirit of the present inventive concept as defined by the appended claims and their equivalents.

What is claimed is:

1. A mixer generating a radio frequency transmit signal, the mixer comprising:
   a load portion connected between an input terminal of a first power voltage and an output terminal of the radio frequency transmit signal and configured to adjust a magnitude of the radio frequency transmit signal;
   a first switching unit connected to an output terminal of the radio frequency transmit signal, and configured to perform a first switching operation in response to a plurality of local oscillation signals; and
   a second switching unit connected between the first switching unit and an input terminal of a second power voltage, lower than the first power voltage, and configured to perform a second switching operation in response to a plurality of baseband signals,
   wherein the plurality of local oscillation signals includes an I+ baseband signal, an I− baseband signal, a Q+ baseband signal, and a Q− baseband signal, and wherein the second switching unit includes a first branch performing a first switching operation under control of the I+ baseband signal and the Q+ baseband signal, a second branch performing a second switching operation under control of the I− baseband signal and the Q− baseband signal, a third branch performing a third switching operation under control of the Q+ baseband signal and the I− baseband signal, and a fourth branch performing a fourth switching operation under control of the Q− baseband signal and the I+ baseband signal.

2. The mixer of claim 1, wherein the plurality of local oscillation signals is obtained by phase-shifting a quadrature signal by a first phase value.

3. The mixer of claim 1, wherein the first to fourth branches are configured to shift a phase of each of the plurality of baseband signals by a second phase value by combining control signals of the first to fourth switching operations of the first to fourth branches, respectively.

4. The mixer of claim 3,
wherein each of the first to fourth branches includes a plurality of transistors connected in parallel to one another, and
wherein the second phase value changes according to a number of activated transistors of the plurality of transistors.

5. The mixer of claim 1,
wherein the load portion includes a first load connected between an input terminal of the first power voltage and a first output terminal of the radio frequency transmit signal, and a second load connected to an input terminal of the first power voltage and a second output terminal of the radio frequency transmit signal, and
wherein each of the first load and the second load includes an inductive device when the radio frequency transmit signal is a millimeter wave.

6. The mixer of claim 5, wherein an inductance value of the inductive device is 0.1 nH or higher and 0.5 nH or lower.

7. A communications device, comprising:
a modulator configured to generate a plurality of first baseband signals by modulating a transmit bitstream;
a local oscillation signal generator configured to generate a plurality of first local oscillation signals and to generate a plurality of second local oscillation signals phase-shifted by a first phase value with respect to the plurality of first local oscillation signals by multiplexing the plurality of first local oscillation signals; and
a mixer configured to generate a radio frequency transmit signal by up-conversion of the plurality of first baseband signals using the plurality of second local oscillation signals,
wherein the mixer is configured to generate a plurality of second baseband signals phase-shifted by a second phase value with respect to the plurality of first baseband signals by combining the plurality of first baseband signals, and to perform a mixing operation with respect to the plurality of second baseband signals and the plurality of second local oscillation signals.

8. The communications device of claim 7, further comprising a receive mixer configured to generate a plurality of first baseband receive signals by down-conversion of a plurality of radio frequency receive signals based on the plurality of second local oscillation signals.

9. The communications device of claim 7, further comprising:
an array antenna for performing beamforming.

10. The communications device of claim 7, wherein the radio frequency transmit signal is obtained by phase-shifting the plurality of first local oscillation signals by a sum of the first phase value and the second phase value.

11. The communications device of claim 7, further comprising:
a plurality of loads connected to an output terminal of the radio frequency transmit signal and configured to adjust a magnitude of the radio frequency transmit signal.

12. The communications device of claim 11, wherein each of the plurality of loads includes at least one microstrip line when the communications device performs wireless communications using a wave of terahertz band.

13. The communications device of claim 7, wherein the local oscillation signal generator includes:
a local oscillator configured to generate a quadrature signal as the plurality of first local oscillation signals; and
a local oscillation buffer configured to generate the plurality of second local oscillation signals by selectively outputting one of the plurality of first local oscillation signals.

14. The communications device of claim 13,
wherein the plurality of first local oscillation signals include an I+ transmit local oscillation signal, an I− transmit local oscillation signal, a Q+ transmit local oscillation signal, and a Q− transmit local oscillation signal, and
wherein the local oscillation buffer is configured to select one of the I+ transmit local oscillation signal, the I− transmit local oscillation signal, the Q+ transmit local oscillation signal, and the Q− transmit local oscillation signal, and to output the selected transmit local oscillation signal as one of the plurality of second local oscillation signals.

15. The communications device of claim 13,
wherein the plurality of first local oscillation signals include an I+ transmit local oscillation signal, an I− transmit local oscillation signal, a Q+ transmit local oscillation signal, and a Q− transmit local oscillation signal, and
wherein the local oscillation buffer includes first to fourth buffer paths each including a plurality of buffers, and is configured to generate the plurality of second local oscillation signals based on combination of the plurality of first local oscillation signals input to the first to fourth buffer paths and an activation status of the first to fourth buffer paths.

16. The communications device of claim 7,
wherein the mixer includes:
a first switching unit configured to perform a switching operation in response to the plurality of second local oscillation signals; and
a second switching unit configured to perform a switching operation in response to the plurality of first baseband signals,
wherein the plurality of second baseband signals are generated in response to a switching operation of the first switching unit.

17. A communications device, comprising:
a modem configured to generate a transmit baseband signal by modulating a transmit bitstream, and to demodulate a receive baseband signal to a receive bitstream;
a transmitter circuit configured to generate a radio frequency transmit signal by frequency up-conversion of the transmit baseband signal using a transmit local oscillation signal; and a receiver circuit configured to generate the receive baseband signal by frequency down-conversion of a radio frequency receive signal using a receive local oscillation signal, wherein the transmit local oscillation signal and the receive local oscillation signal are obtained by phase-shifting a quadrature signal, and wherein the transmitter circuit is configured to perform the frequency up-conversion of the transmit baseband signal after phase-shifting the transmit baseband signal based on the transmit local oscillation signal.

18. The communications device of claim 17, wherein the transmitter circuit includes:
 an analog-digital converter configured to convert the transmit baseband signal to an analog signal;
 an analog filter configured to perform frequency-filtering for the transmit baseband signal converted to the analog signal; and
 a mixer configured to mix the frequency-filtered transmit baseband signal with the transmit local oscillation signal.

19. The communications device of claim 17, wherein the transmitter circuit is configured to phase-shift the transmit baseband signal to 45 degrees or less.

20. The communications device of claim 17,
 wherein the transmit baseband signal includes an I+ transmit baseband signal, an I− transmit baseband signal, a Q+ transmit baseband signal, and a Q− transmit baseband signal, and
 wherein the transmitter circuit is configured to phase-shift the transmit baseband signal by forming a plurality of pairs of signals selected from among the I+ transmit baseband signal, the I− transmit baseband signal, the Q+ transmit baseband signal, or the Q− transmit baseband signal.

\* \* \* \* \*